United States Patent
Tang et al.

(10) Patent No.: US 12,388,566 B2
(45) Date of Patent: Aug. 12, 2025

(54) COMMUNICATION METHOD AND APPARATUS

(71) Applicant: HUAWEI TECHNOLOGIES CO., LTD., Guangdong (CN)

(72) Inventors: Zihan Tang, Shenzhen (CN); Mengyao Ma, Shenzhen (CN); Jiaqi Gu, Shenzhen (CN); Jiahui Li, Shenzhen (CN); Wei Lin, Shenzhen (CN); Xun Yang, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 18/430,905

(22) Filed: Feb. 2, 2024

(65) Prior Publication Data

US 2024/0171311 A1   May 23, 2024

Related U.S. Application Data

(63) Continuation of application No. PCT/CN2022/106100, filed on Jul. 15, 2022.

(30) Foreign Application Priority Data

Aug. 6, 2021   (CN) .......................... 202110902761.6

(51) Int. Cl.
    H04L 1/00 (2006.01)
(52) U.S. Cl.
    CPC .......... H04L 1/0076 (2013.01); H04L 1/0061 (2013.01)

(58) Field of Classification Search
    CPC ... H04L 1/0041; H04L 1/0045; H04L 1/0057; H04L 1/0061; H04L 1/0076; H03M 13/05; H03M 13/09; H03M 13/6312; H03M 13/6318
    See application file for complete search history.

(56) References Cited

U.S. PATENT DOCUMENTS

| | | | | |
|---|---|---|---|---|
| 2015/0280751 A1* | 10/2015 | Naiss | ................ | H03M 13/6312 714/752 |
| 2016/0309363 A1* | 10/2016 | Persson | .................... | H04L 69/22 |
| 2022/0138044 A1* | 5/2022 | Luo | .................... | H03M 13/6318 714/764 |

OTHER PUBLICATIONS

"3rd Generation Partnership Project; Technical Specification Group Radio Access Network; Multiplexingand Channel Coding (FDD)", 3GPP TS 25.212 V3.0.0, XX, XX, Jun. 1, 2000 (Jun. 1, 2000), pp. 1-62, XP002202956.
(Continued)

*Primary Examiner* — Shelly A Chase
(74) *Attorney, Agent, or Firm* — Rimon PC

(57) ABSTRACT

This application discloses a communication method that comprises obtaining first data, where the length of the first data is A; compressing the first data into second data, where the length of the second data is C; and generating third data based on the second data, where the third data includes the second data and (T−C+p) alignment bits. T is a threshold in the J thresholds that is greater than or equal to C and the closest to C. The J thresholds correspond to A and are greater than 0, with J being a positive integer greater than or equal to 2. p is a quantity of auxiliary check bits and is an integer greater than or equal to 0. The communication method further comprises performing channel encoding on the third data to obtain fourth data and sending the fourth data.

18 Claims, 13 Drawing Sheets

(56) References Cited

OTHER PUBLICATIONS

Cedric Marchand: "Implementation of an LDPC decoder for the DVB-S2, -T2 and -C2 standards", HAL archives-ouvertes, Jan. 10, 2010 (Jan. 10, 2010), XP055333897, total 145 pages.

\* cited by examiner

COMMUNICATION METHOD AND APPARATUS

CROSS-REFERENCE TO RELATED APPLICATIONS

This application is a continuation of International Patent Application No. PCT/CN2022/106100, filed on Jul. 15, 2022, which claims priority to Chinese Patent Application No. 202110902761.6, filed on Aug. 6, 2021. The disclosures of the aforementioned applications are hereby incorporated by reference in their entireties.

TECHNICAL FIELD

This application relates to the communication field, and in particular, to a communication method and apparatus.

BACKGROUND

In an existing communication system, when a sending end sends to-be-transmitted data to a receiving end, a physical layer of the sending end usually performs operations such as channel encoding and modulation on the to-be-transmitted data, to combat channel transmission errors.

However, in actual communication, due to a limited error protection capability of channel encoding, when a channel condition becomes poor, the receiving end may fail to correctly restore the data sent by the sending end. As a result, a block error rate (BLER) is high. Alternatively, excessive transmission resources are consumed in existing channel coding techniques due to a large amount of retransmission, causing a large delay. In view of this issue, how to further improve the error protection capability of channel encoding becomes a very practical problem.

SUMMARY

This application provides a communication method and apparatus, so that an error protection capability of channel encoding can be improved by reducing a code rate of channel encoding. As such, a BLER of transmission is reduced and transmission reliability is improved.

To achieve the foregoing objectives, the following technical solutions are used in this application.

According to a first aspect, this application provides a communication method. The communication method may be applied to a sending end. The sending end is a device that sends data, and the sending end may be a terminal device (for example, a mobile phone) or a network device (for example, a base station) in a communication system. The communication method provided in the first aspect of this application includes: obtaining first data, where a length of the first data is A, and A is a positive integer; compressing the first data into second data, where a length of the second data is C, and C is a positive integer; generating third data based on the second data, where the third data includes the second data and T−C+p alignment bits, T is one of the J thresholds that is greater than or equal to C and the closest to C, the J thresholds correspond to A, the J thresholds are greater than 0, J is a positive integer greater than or equal to 2, p is a quantity of auxiliary check bits, and p is an integer greater than or equal to 0; and performing channel encoding on the third data, to obtain fourth data; and sending the fourth data.

Based on the communication method in the first aspect, the first data may be to-be-transmitted data, and the third data may be considered as data obtained by compressing and aligning the to-be-transmitted data. In other words, in this application, channel encoding may be performed after the to-be-transmitted data is compressed and aligned. In this way, a code rate during channel encoding can be reduced, to improve an error protection capability of channel encoding, reduce a BLER of transmission, and improve transmission reliability.

In addition, a length of the third data is related to a redundancy degree of the first data. If the redundancy degree of the first data is greater, the length of the third data is smaller. In other words, in this application, a code rate of a channel code during channel encoding can be adaptively adjusted based on a redundancy degree of the to-be-transmitted data. When the redundancy degree of the to-be-transmitted data is greater, the code rate of the channel code during channel encoding is lower, the error protection capability of channel encoding is stronger, and the transmission reliability is higher.

In some possible designs, the T−C+p alignment bits may be any one of the following: T−C+p check bits, T−C+p repeated bits, T−C+p "0" bits, or T−C+p "1" bits.

In some possible designs, the communication method in the first aspect may further include: sending first information, where the first information corresponds to T. In this way, a receiving end may obtain, by using T, a channel code used when the sending end performs channel encoding, perform channel decoding on to-be-decoded data by using the channel code, and then perform decompression, to obtain the first data sent by the sending end. A process of determining and selecting the to-be-decoded data by the receiving end can be skipped, so that decoding complexity of the receiving end is simplified, and decoding performance of the receiving end is improved.

In some possible designs, the J thresholds are variable.

In some possible designs, transmission of the J thresholds may be performed by using any one of the following signaling: radio resource control (RRC) signaling, downlink control information (DCI) signaling, or media access control control element (MAC CE) signaling.

In some possible designs, the communication method in the first aspect may be applied to a physical layer.

According to a second aspect, this application provides a communication method. The communication method may be applied to a receiving end. The receiving end refers to a device that receives data, and the receiving end may be a terminal device (for example, a mobile phone) or a network device (for example, a base station) in a communication system. The communication method provided in the second aspect of this application includes: receiving to-be-decoded data, where the to-be-decoded data corresponds to N, which may represent a length of the to-be-decoded data, and N corresponds to A; performing channel decoding on the to-be-decoded data, to obtain a first decoding result, where the first decoding result includes third data, where the third data includes second data and T−C+p alignment bits, T is one of the J thresholds that is greater than or equal to C and the closest to C, the J thresholds correspond to A, the J thresholds are greater than 0, J is a positive integer greater than or equal to 2, C is a length of the second data, C is a positive integer, p is a quantity of auxiliary check bits, and p is an integer greater than or equal to 0; and obtaining first data based on the third data, where a length of the first data is A.

In some possible designs, the second data is obtained by compressing the first data.

In some possible designs, the first data may be a sequence that meets a similarity criterion and that is in a first candidate set. The first candidate set includes X1 candidate results that pass a check in X2 candidate results in a second candidate set. The second candidate set includes the X2 candidate results that pass interval confirmation in J candidate results in a third candidate set. The third candidate set includes the J candidate results obtained by decompressing and compressing the first decoding result based on the J thresholds.

In some possible designs, the T−C+p alignment bits may be any one of the following: T−C+p check bits, T−C+p repeated bits, T−C+p "0" bits, or T−C+p "1" bits.

In some possible designs, the communication method in the second aspect may further include: receiving first information, where the first information corresponds to T.

In some possible designs, the J thresholds are variable.

In some possible designs, transmission of the J thresholds may be performed by using any one of the following signaling: RRC signaling, DCI signaling, or MAC CE signaling.

In some possible designs, the communication method in the second aspect may be applied to a physical layer.

It should be noted that, for a technical effect of the communication method in the second aspect, refer to a technical effect of the communication method in the first aspect. Details are not described herein again.

According to a third aspect, a communication apparatus is provided. The communication apparatus includes a processing module and a transceiver module. The processing module is configured to obtain first data, where a length of the first data is A, and A is a positive integer. The processing module is further configured to compress the first data into second data, where a length of the second data is C, and C is a positive integer. The processing module is further configured to generate third data based on the second data. The third data includes the second data and T−C+p alignment bits. T is one of the J thresholds that is greater than or equal to C and is the closest to C. The J thresholds correspond to A, and the J thresholds are greater than 0. J is a positive integer greater than or equal to 2. p is a quantity of auxiliary check bits, and p is an integer greater than or equal to 0. The processing module is further configured to perform channel encoding on the third data, to obtain fourth data. The transceiver module is configured to send the fourth data.

In some possible designs, the T−C+p alignment bits may be any one of the following: T−C+p check bits, T−C+p repeated bits, T−C+p "0" bits, or T−C+p "1" bits.

In some possible designs, the transceiver module is further configured to send first information, where the first information corresponds to T.

In some possible designs, the J thresholds are variable.

In some possible designs, transmission of the J thresholds may be performed by using any one of the following signaling: RRC signaling, DCI signaling, or MAC CE signaling.

Optionally, the transceiver module may include a receiving module and a transmitting module. The receiving module is configured to implement a receiving function of the communication apparatus in the third aspect, and the transmitting module is configured to implement a sending function of the communication apparatus in the third aspect.

Optionally, the communication apparatus in the third aspect may further include a storage module, and the storage module stores a program or instructions. When the processing module executes the program or the instructions, the communication apparatus is enabled to perform the communication method in the first aspect.

It should be noted that the communication apparatus in the third aspect may be a sending end, or may be a chip (system) or another component or assembly disposed in the sending end, or may be an apparatus including the sending end. This is not limited in this application. The sending end refers to a device that sends data, and the sending end may be a terminal device (for example, a mobile phone) or a network device (for example, a base station) in a communication system.

In addition, for a technical effect of the communication apparatus in the third aspect, refer to a technical effect of the communication method in the first aspect. Details are not described herein again.

According to a fourth aspect, a communication apparatus is provided. The communication apparatus includes a transceiver module and a processing module. Term "module" in the present application may refer to a piece of hardware or a hardware component or a combination of hardware and software or a software component. The transceiver module is configured to receive to-be-decoded data, where the to-be-decoded data corresponds to N, and N corresponds to A. The processing module is configured to perform channel decoding on the to-be-decoded data, to obtain a first decoding result, where the first decoding result includes third data. The third data includes second data and T−C+p alignment bits. C is a length of the second data, and C is a positive integer. T is one of the J thresholds that is greater than or equal to C and is the closest to C. The J thresholds correspond to A, and the J thresholds are greater than 0. J is a positive integer greater than or equal to 2. p is a quantity of auxiliary check bits, and p is an integer greater than or equal to 0. The processing module is further configured to obtain first data based on the third data, where a length of the first data is A.

In some possible designs, the second data is obtained by compressing the first data.

In some possible designs, the first data may be a sequence that meets a similarity criterion and that is in a first candidate set. The first candidate set includes X1 candidate results that pass a check in X2 candidate results in a second candidate set. The second candidate set includes the X2 candidate results that pass interval confirmation in J candidate results in a third candidate set. The third candidate set includes the J candidate results obtained by decompressing and compressing the first decoding result based on the J thresholds.

In some possible designs, the T−C+p alignment bits may be any one of the following: T−C+p check bits, T−C+p repeated bits, T−C+p "0" bits, or T−C+p "1" bits.

In some possible designs, the transceiver module is further configured to receive first information, where the first information corresponds to T.

In some possible designs, the J thresholds are variable.

In some possible designs, transmission of the J thresholds may be performed by using any one of the following signaling: RRC signaling, DCI signaling, or MAC CE signaling.

Optionally, the transceiver module may include a receiving module and a sending module. The receiving module is configured to implement a receiving function of the communication apparatus in the fourth aspect, and the sending module is configured to implement a sending function of the communication apparatus in the fourth aspect.

Optionally, the communication apparatus in the fourth aspect may further include a storage module, and the storage module stores a program or instructions. When the processing module executes the program or the instructions, the communication apparatus is enabled to perform the communication method in the second aspect.

It should be noted that the communication apparatus in the fourth aspect may be a receiving end, may be a chip (system) or another component or assembly disposed in the receiving end, or may be an apparatus including the receiving end. This is not limited in this application. The receiving end refers to a device that receives data, and the receiving end may be a terminal device (for example, a mobile phone) or a network device (for example, a base station) in a communication system.

In addition, for a technical effect of the communication apparatus in the fourth aspect, refer to a technical effect of the communication method in the second aspect. Details are not described herein again.

According to a fifth aspect, a communication apparatus is provided. The communication apparatus is configured to perform the communication method in any one of implementations of the first aspect and the second aspect.

In this application, the communication apparatus in the fifth aspect may be a receiving end or a sending end, may be a chip (system) or another component or assembly disposed in the receiving end or the sending end, or may be an apparatus including the receiving end or the sending end. This is not limited in this application. The receiving end refers to a device that receives data, and the receiving end may be a terminal device (for example, a mobile phone) or a network device (for example, a base station) in a communication system. The sending end refers to a device that sends data, and the sending end may be a terminal device (for example, a mobile phone) or a network device (for example, a base station) in a communication system. The sending end is configured to perform the communication method in any one of possible implementations of the first aspect, and the receiving end is configured to perform the communication method in any one of possible implementations of the second aspect.

It should be understood that the communication apparatus in the fifth aspect includes a corresponding module, unit, or means for implementing the communication method in either of the first aspect and the second aspect. The module, the unit, or the means may be implemented as hardware, may be implemented as software, or may be implemented as hardware executing corresponding software. The hardware or software includes one or more modules or units configured to perform functions related to the foregoing communication methods.

In addition, for a technical effect of the communication apparatus in the fifth aspect, refer to a technical effect of the communication method in either of the first aspect and the second aspect. Details are not described herein again.

According to a sixth aspect, a communication apparatus is provided. The communication apparatus includes a processor. The processor is configured to perform the communication method in any one of possible implementations of the first aspect and the second aspect.

In a possible design solution, the communication apparatus in the sixth aspect may further include a transceiver. The transceiver may be a transceiver circuit or an interface circuit. The transceiver may be used by the communication apparatus in the sixth aspect to communicate with another communication apparatus.

In a possible design solution, the communication apparatus in the sixth aspect may further include a memory. The memory may be integrated with the processor, or may be disposed separately. The memory may be configured to store a computer program and/or data related to the communication method in either of the first aspect and the second aspect.

In this application, the communication apparatus in the sixth aspect may be a receiving end or a sending end, may be a chip (system) or another component or assembly disposed in the receiving end or the sending end, or may be an apparatus including the receiving end or the sending end. This is not limited in this application. The receiving end refers to a device that receives data, and the receiving end may be a terminal device (for example, a mobile phone) or a network device (for example, a base station) in a communication system. The sending end refers to a device that sends data, and the sending end may be a terminal device (for example, a mobile phone) or a network device (for example, a base station) in a communication system. The sending end is configured to perform the communication method in any one of possible implementations of the first aspect, and the receiving end is configured to perform the communication method in any one of possible implementations of the second aspect.

In addition, for a technical effect of the communication apparatus in the sixth aspect, refer to a technical effect of the communication method in any one of possible implementations of the first aspect and the second aspect. Details are not described herein again.

According to a seventh aspect, a communication apparatus is provided. The communication apparatus includes a processor. The processor is coupled to a memory, and the processor is configured to execute a computer program stored in the memory, to enable the communication apparatus to perform the communication method in any one of possible implementations of the first aspect and the second aspect.

In a possible design solution, the communication apparatus in the seventh aspect may further include a transceiver. The transceiver may be a transceiver circuit or an interface circuit. The transceiver may be used by the communication apparatus in the seventh aspect to communicate with another communication apparatus.

In this application, the communication apparatus in the seventh aspect may be a receiving end or a sending end, may be a chip (system) or another component or assembly disposed in the receiving end or the sending end, or may be an apparatus including the receiving end or the sending end. This is not limited in this application. The receiving end refers to a device that receives data, and the receiving end may be a terminal device (for example, a mobile phone) or a network device (for example, a base station) in a communication system. The sending end refers to a device that sends data, and the sending end may be a terminal device (for example, a mobile phone) or a network device (for example, a base station) in a communication system. The sending end is configured to perform the communication method in any one of possible implementations of the first aspect, and the receiving end is configured to perform the communication method in any one of possible implementations of the second aspect.

In addition, for a technical effect of the communication apparatus in the seventh aspect, refer to a technical effect of the communication method in any one of possible implementations of the first aspect and the second aspect. Details are not described herein again.

According to an eighth aspect, a communication apparatus is provided. The communication apparatus includes a processor and an interface circuit. The interface circuit is configured to receive code instructions and transmit the code instructions to the processor. The processor is configured to run the code instructions to perform the communication method in any one of implementations of the first aspect and the second aspect.

In a possible design solution, the communication apparatus in the eighth aspect may further include a memory. The memory may be integrated with the processor, or may be disposed separately. The memory may be configured to store a computer program and/or data related to the communication method in either of the first aspect and the second aspect.

In this application, the communication apparatus in the eighth aspect may be a receiving end or a sending end, may be a chip (system) or another component or assembly disposed in the receiving end or the sending end, or may be an apparatus including the receiving end or the sending end. This is not limited in this application. The receiving end refers to a device that receives data, and the receiving end may be a terminal device (for example, a mobile phone) or a network device (for example, a base station) in a communication system. The sending end refers to a device that sends data, and the sending end may be a terminal device (for example, a mobile phone) or a network device (for example, a base station) in a communication system. The sending end is configured to perform the communication method in any one of possible implementations of the first aspect, and the receiving end is configured to perform the communication method in any one of possible implementations of the second aspect.

In addition, for a technical effect of the communication apparatus in the eighth aspect, refer to a technical effect of the communication method in any one of possible implementations of the first aspect and the second aspect. Details are not described herein again.

According to a ninth aspect, a communication apparatus is provided. The communication apparatus includes a processor and a storage medium. The storage medium stores instructions. When the instructions are run by the processor, the communication method in any one of possible implementations of the first aspect and the second aspect is implemented.

In this application, the communication apparatus in the ninth aspect may be a receiving end or a sending end, may be a chip (system) or another component or assembly disposed in the receiving end or the sending end, or may be an apparatus including the receiving end or the sending end. This is not limited in this application. The receiving end refers to a device that receives data, and the receiving end may be a terminal device (for example, a mobile phone) or a network device (for example, a base station) in a communication system. The sending end refers to a device that sends data, and the sending end may be a terminal device (for example, a mobile phone) or a network device (for example, a base station) in a communication system. The sending end is configured to perform the communication method in any one of possible implementations of the first aspect, and the receiving end is configured to perform the communication method in any one of possible implementations of the second aspect.

In addition, for a technical effect of the communication apparatus in the ninth aspect, refer to a technical effect of the communication method in any one of possible implementations of the first aspect and the second aspect. Details are not described herein again.

According to a tenth aspect, a processor is provided. The processor is configured to perform the communication method in any one of possible implementations of the first aspect and the second aspect.

According to an eleventh aspect, a communication system is provided. The communication system includes a terminal device and a network device. The network device may include an access network device and a core network device. The terminal device may serve as a sending end or a receiving end, and the network device may be used as a sending end or a receiving end. The sending end is configured to perform the communication method in any one of possible implementations of the first aspect, and the receiving end is configured to perform the communication method in any one of possible implementations of the second aspect.

According to a twelfth aspect, a computer-readable storage medium is provided. The computer-readable storage medium includes instructions. When the instructions are run by a processor, the communication method in any one of possible implementations of the first aspect and the second aspect is implemented.

According to a thirteenth aspect, a computer program product is provided. The computer program product includes instructions. When the instructions are run by a processor, the communication method in any one of possible implementations of the first aspect and the second aspect is implemented.

For a technical effect brought by any one of implementations of the third aspect to the thirteenth aspect, refer to a technical effect brought by a corresponding implementation in the first aspect or the second aspect. Details are not described herein again.

Based on implementations provided in the foregoing aspects, further combination may be performed in this application to provide more implementations.

DESCRIPTION OF EMBODIMENTS

The following describes technical solutions in this application with reference to accompanying drawings.

The technical solutions in embodiments of this application may be applied to a wireless communication system. For example, the wireless communication system may be a 4th generation (4G) communication system (such as a long term evolution (LTE) system), a fifth generation (5G) communication system (such as a new radio (NR) system), and a future mobile communication system. The technical solutions in embodiments of this application may alternatively be applied to a satellite communication system, where the satellite communication system may be integrated with the wireless communication system.

Aspects, embodiments, or features are presented in this application by describing a system that may include a plurality of devices, assemblies, modules, and the like. It should be understood that each system may include another device, assembly, module, and the like, and/or may not include all devices, assemblies, modules, and the like discussed with reference to the accompanying drawings. In addition, a combination of these solutions may alternatively be used.

In addition, in embodiments of this application, terms such as "example" and "for example" represent giving an example, an illustration, or a description. Any embodiment or design solution described as an "example" in this application should not be explained as being more preferred or having more advantages than another embodiment or design solution. Rather, use of the term example is intended to present a concept in a concrete way.

In embodiments of this application, "information", a "signal", a "message", a "channel", and "signaling" may be interchangeably used sometimes. It should be noted that meanings expressed by the terms are consistent when differences are not emphasized. "Of", "relevant", and "corresponding" may be mixed. It should be noted that meanings expressed by the terms are consistent when differences are not emphasized.

In embodiments of this application, a subscript such as $W_1$ may be mistyped in a non-subscript form, such as W1. Meanings expressed by the terms are consistent when the difference is not expressly stated.

A network architecture and a service scenario described in embodiments of this application are intended to describe the technical solutions in embodiments of this application more clearly, and do not constitute a limitation on the technical solutions provided in embodiments of this application. A person of ordinary skill in the art may know that, with evolution of the network architecture and emergence of a new service scenario, the technical solutions provided in embodiments of this application are also applicable to a similar technical problem.

Figure 1:
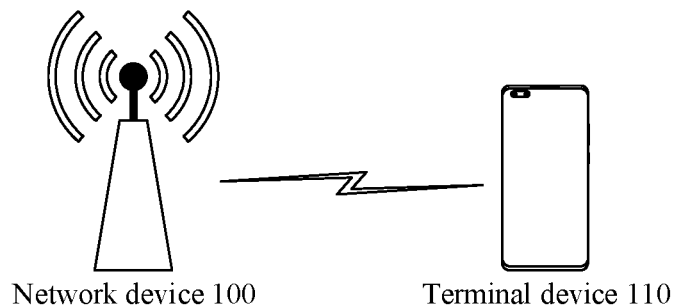
FIG. 1 is a schematic diagram of an architecture of a communication system according to an embodiment of this application.

An embodiment of this application provides a communication system. The communication system is applicable to communication between a network device and a terminal device. The communication system provided in this embodiment of this application may include one or more network devices and one or more terminal devices. In an example, FIG. 1 is a schematic diagram of an architecture of a communication system according to an embodiment of this application. As shown in FIG. 1, the communication system may include a network device 100 and a terminal device 110. The network device 100 and the terminal device 110 may be connected in a wireless manner.

In some possible embodiments, the communication system provided in this embodiment of this application may include one network device and a plurality of terminal devices. Alternatively, the communication system may include a plurality of network devices and one terminal device. Alternatively, the communication system may include a plurality of network devices and a plurality of terminal devices. Therefore, a quantity of network devices and a quantity of terminal devices in the communication system are not limited in this embodiment of this application.

The communication system provided in embodiment of this application is alternatively applicable to communication between network devices, communication between terminal devices, and communication in vehicle-to-everything, an internet of things, and an industrial internet. Therefore, types of devices at two communication ends in the communication system are not limited in this embodiment of this application.

Optionally, the network device in embodimenta of this application is a device connecting a terminal device to a wireless network. The network device may be a node in a radio access network, may also be referred to as a base station, or may be referred to as a radio access network (RAN) node (or device). For example, the network device may include an evolved NodeB (NodeB or eNB or eNodeB) in an LTE system or an LTE-advanced (LTE-A) system, such as a conventional macro base station eNB and a micro base station eNB that is in a heterogeneous network scenario. Alternatively, the network device may include a next generation NodeB (gNB) in a 5G NR system. Alternatively, the network device may further include a transmission reception point (TRP) and a home base station (for example, a home evolved NodeB, or a home NodeB, HNB), a baseband unit (BBU), a baseband pool BBU pool, a wireless fidelity (Wi-Fi) access point (AP), or the like. Alternatively, the network device may further include a central unit (CU) and a distributed unit (DU) in a cloud radio access network (CloudRAN) system. Alternatively, the network device may include a network device in a non-terrestrial network (NTN). To be specific, the network device may be deployed on a high-altitude platform or a satellite. In the NTN, the network device may serve as a layer 1 (L1) relay (relay), or may serve as a base station, or may serve as a DU, or may serve as an integrated access and backhaul (IAB) node. This is not limited in this embodiment of this application. Certainly, the network device may alternatively be a node in a core network.

Optionally, the terminal device in embodiments of this application may be a device configured to implement a wireless communication function, for example, a terminal or a chip that can be used in a terminal. The terminal may be user equipment (UE) in a 5G network or a future evolved public land mobile network (PLMN), an access terminal, a terminal unit, a terminal station, a mobile station, a mobile console, a remote station, a remote terminal, a mobile device, a wireless communication device, a terminal agent, or a terminal apparatus. The access terminal may be a cellular phone, a cordless phone, a session initiation protocol (SIP) phone, a wireless local loop (WLL) station, a personal digital assistant (PDA), a handheld device having a wireless communication function, a computing device or another processing device connected to a wireless modem, a vehicle-mounted device or a wearable device, a virtual reality (VR) terminal device, an augmented reality (AR) terminal device, a wireless terminal in industrial control, a wireless terminal in self driving, an uncrewed aerial vehicle, a wireless terminal in remote medical, a wireless terminal in smart grid, and a wireless terminal in transportation safety, a wireless terminal in a smart city, a wireless terminal in a smart home, and the like. Alternatively, the terminal may be a terminal (for example, a vehicle-to-everything device) in vehicle-to-everything (vehicle-to-everything, V2X), a terminal in device-to-device communication, a terminal in machine-to-machine (M2M) communication, or the like. The terminal may be mobile or fixed.

The network device and the terminal device in embodiments of this application may be deployed on land, including indoors or outdoors, handheld, or vehicle-mounted, may be deployed on the water surface, or may be deployed in an airplane, a balloon and a satellite in the air. An application scenario of the network device and the terminal device is not limited in this embodiment of this application.

The network device and the terminal device in embodiments of this application may communicate with each other by using a licensed spectrum, may communicate with each other by using an unlicensed spectrum, or may communicate with each other by using both the licensed spectrum and the unlicensed spectrum. The network device and the terminal device may communicate with each other by using a spectrum below 6 gigahertz (GHz), may communicate with each other by using a spectrum above 6 GHz, or may communicate with each other by using both the spectrum below 6 GHz and the spectrum above 6 GHz. A spectrum resource used between the network device and the terminal device is not limited in this embodiment of this application.

It should be noted that, in the communication system provided in this embodiment of this application, when a device (including a network device or a terminal device) sends data to another device (including a network device or a terminal device), where the device that sends the data is a sending end, and the device that receives the data is a receiving end. The sending end may implement functions such as signal generation and sending, and may be a network device or a terminal device. The receiving end may implement functions such as signal obtaining and processing, and may be a network device or a terminal device. FIG. 1 is used as an example. In an uplink communication scenario, the network device 100 sends data to the terminal device 110, where the network device 100 is a sending end, and the terminal device 110 is a receiving end. In a downlink communication scenario, the terminal device 110 sends data to the network device 100, where the terminal device 110 is a sending end, and the network device 100 is a receiving end. Certainly, in the communication system provided in this embodiment of this application, one terminal device may send data to another terminal device. In this case, a sending end and a receiving end are different terminal devices. One network device may send data to another network device. In this case, a sending end and a receiving end are different network devices.

In some possible cases, a sending end may serve as a receiving end to implement functions such as signal obtaining and processing, and a receiving end may serve as a sending end to implement functions such as signal generation and sending. In other words, a physical device may be a sending end, may be a receiving end, or may be both the sending end and the receiving end.

The communication system provided in this application is described above, and the following briefly describes technologies related to this application.

Currently, a physical layer of a sending end usually assumes, by default, that compression processing has been performed on to-be-transmitted data from an upper layer of the physical layer, and there is no redundancy. Therefore, when sending the to-be-transmitted data, the physical layer of the sending end does not perform compression processing on the to-be-transmitted data, but performs operations such as channel encoding and modulation on the to-be-transmitted data, to combat channel transmission errors.

Figure 2:
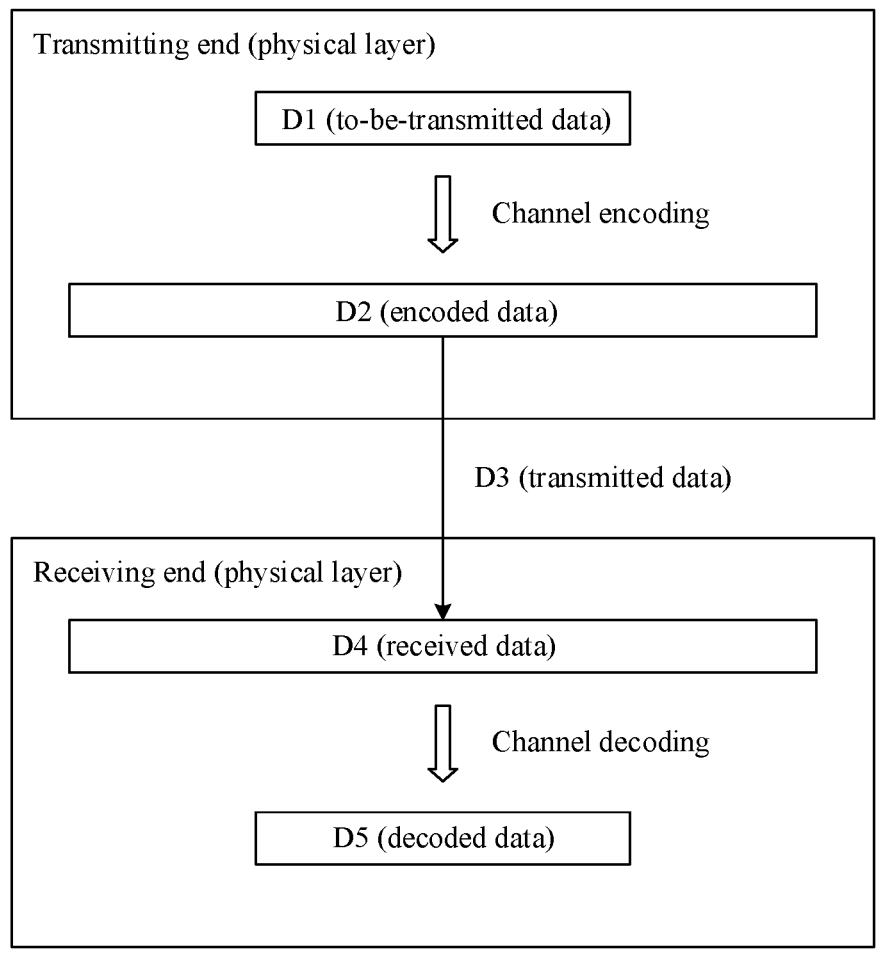
FIG. 2 is a schematic diagram of sending data to a receiving end by a sending end.

As shown in FIG. 2, in a process in which a sending end sends data to a receiving end, a physical layer of the sending end first performs channel encoding on D1 (to-be-transmitted data), to obtain D2 (encoded data). Then, the physical layer of the sending end performs operations such as modulation and resource mapping on D2, to obtain D3 (transmitted data), and sends D3 to the receiving end. After receiving D3 from the sending end, the receiving end first performs operations such as resource demapping and demodulation on D3, to obtain D4 (received data, also referred to as to-be-decoded data). Then, a physical layer of the receiving end performs channel decoding on D4, to obtain D5 (decoded data). D5 is D1 in the sending end. However, because an error protection capability of channel encoding is limited, when a channel condition becomes poor, the receiving end may fail to correctly restore D5. As a result, a BLER is high, and transmission reliability is poor. Alternatively, excessive transmission resources are occupied due to a large amount of retransmission, and a large delay is caused.

After careful research, it is discovered that, in actual communication, to-be-transmitted data at a physical layer is not completely ideal data without redundancy. For example, there is usually redundancy in data (for example, data such as a channel state information (CSI) feedback, various control signaling, sensing, and positioning) generated at the physical layer and a data packet from an upper layer of the physical layer. In brief, there may actually be redundancy in the to-be-transmitted data at the physical layer, and the redundancy in the to-be-transmitted data is not fully used.

To resolve the foregoing problem, an embodiment of this application provides a communication method. In the communication method, the redundancy in the to-be-transmitted data is utilized, to improve an error protection capability of channel encoding. The communication method provided in embodiments of this application may be applied to the foregoing communication system, and may be performed by the terminal device or the network device in the foregoing communication system.

Figure 3:
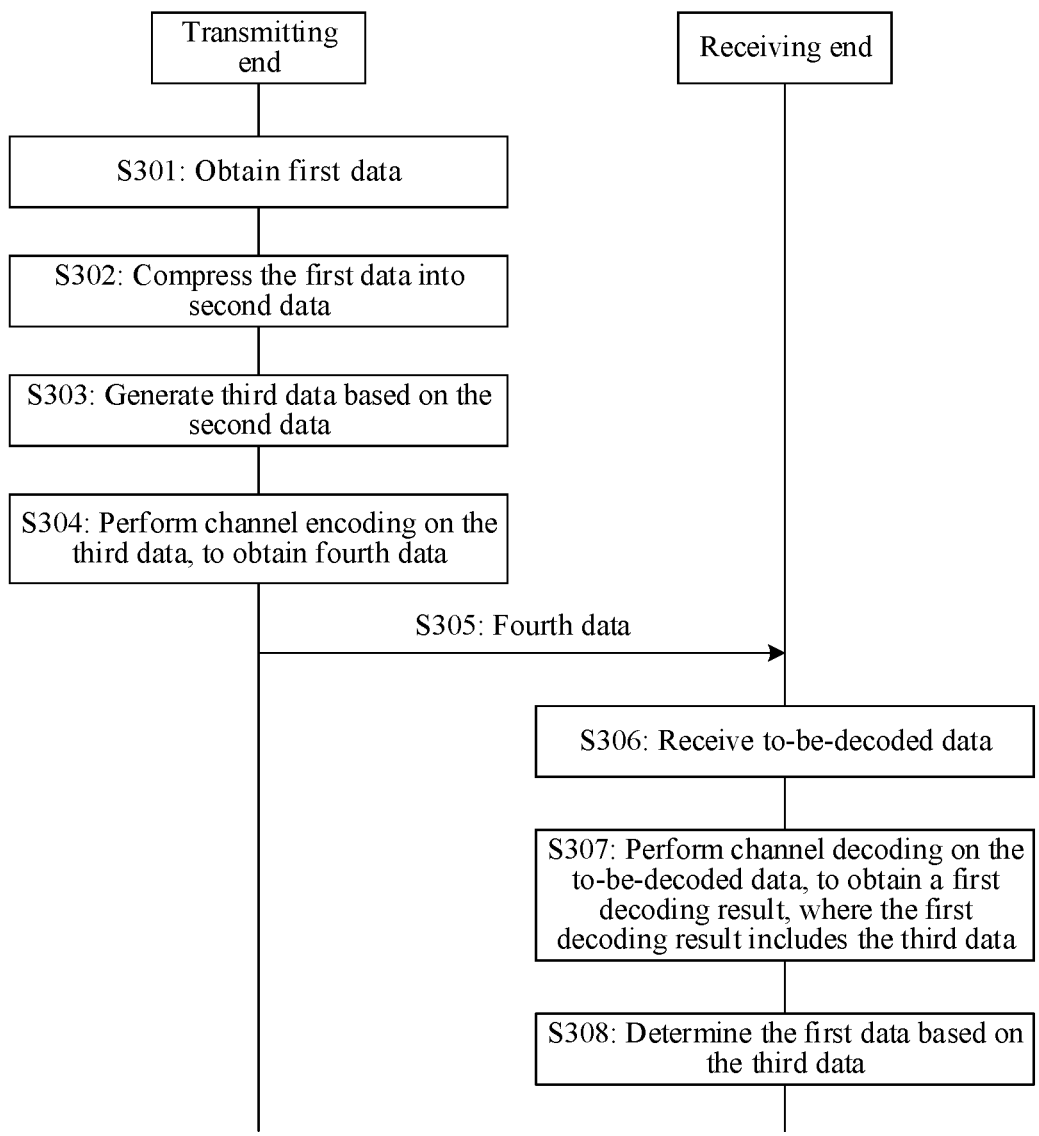
FIG. 3 is a schematic flowchart 1 of a communication method according to an embodiment of this application.

FIG. 3 is a schematic flowchart 1 of a communication method according to an embodiment of this application. The method may include S301 to S308.

S301: A sending end obtains first data.

The first data may be data that is in the sending end and that needs to be sent to a receiving end, in other words, the first data may be to-be-transmitted data in the sending end. A length of the first data is A, and A is a positive integer. For example, A may be 128 bits, 256 bits, or 512 bits. It should be noted that, unless otherwise specified, A in the following may represent the length of the first data. Unified descriptions are provided herein, and details are not described below again.

The length of the first data A may be determined by a network device (for example, a base station). For example, when the sending end is a network device, the sending end may determine the length of the first data, and may add, to scheduling information sent to a terminal device, information indicating the length of the first data. When the sending end is a terminal device, the sending end may obtain scheduling information from a network device, and determine the length of the first data based on an indication of the scheduling information. The foregoing scheduling information may be scheduling information in DCI.

In actual application, the first data may be data from an upper layer (for example, an application layer) of a physical layer of the sending end. Alternatively, the first data may be data generated at the physical layer of the sending end, for example, data such as a CSI feedback, various control signaling, sensing, and positioning. It may be understood that a type, a source, a length, an encoding manner, and the like of the first data are not limited in this application.

S302: The sending end compresses the first data into second data.

The sending end may compress the first data into the second data by using a compression algorithm. The compression algorithm may be a lossless compression algorithm, and the lossless compression algorithm may be referred to as reversible transformation.

In some possible embodiments, the foregoing compression algorithm may be any one of the following compression algorithms: online arithmetic code (which may also be referred to as online arithmetic encoding), off-line arithmetic code (which may also be referred to as off-line arithmetic encoding), Huffman coding, or the like. It may be understood that a type of the compression algorithm is not limited in this application.

After the first data is compressed into the second data by using the compression algorithm, a length of the second data is C, and C is a positive integer. As a general rule, if a redundancy degree of data (which may also be referred to as a sequence) is greater, a length of the data after being compressed by using the compression algorithm is smaller. Therefore, when the first data is compressed into the second data by using the compression algorithm, a value of C is related to a redundancy degree of the first data, and a greater redundancy degree of the first data indicates a smaller C. It should be noted that, unless otherwise specified, C in the following may represent the length of the second data. Unified descriptions are provided herein, and details are not described below again.

Figure 4:
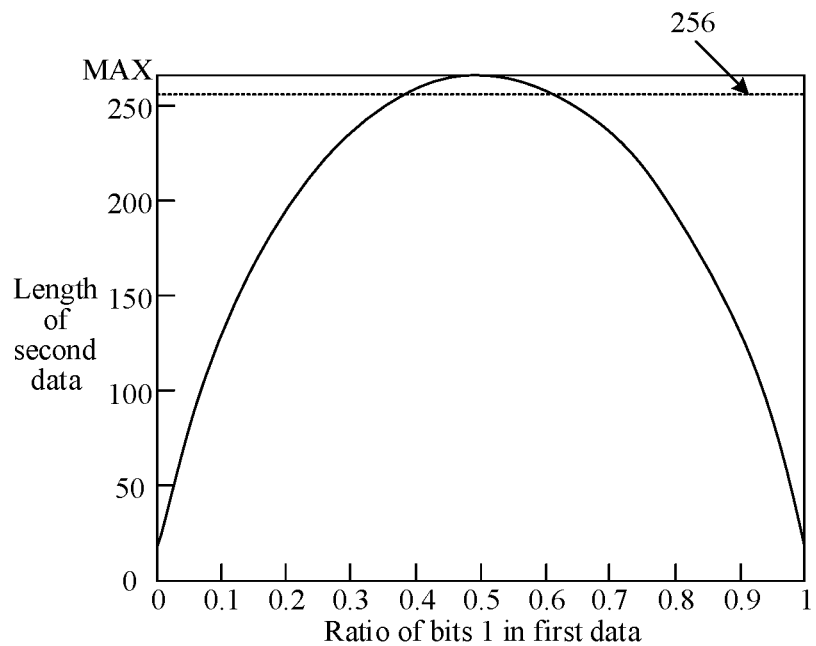
FIG. 4 is a schematic diagram of a correspondence between a redundancy degree of first data and a length of second data according to an embodiment of this application.

For example, if a redundancy degree of data is related only to a ratio of bits "1" in the data, and a ratio of bits "1" in the data closer to 0.5 indicates a lower redundancy degree of the data. In this case, when the first data is compressed into the second data by using the compression algorithm, as shown in FIG. 4, a ratio of bits "1" in the first data closer to 0.5 (that is, a lower redundancy degree of the first data) indicates larger C, and a ratio of bits "1" in the first data closer to 0 or 1 (that is, a greater redundancy degree of the first data) indicates smaller C. FIG. 4 shows a correspondence between the redundancy degree of the first data and the length of the second data. In FIG. 4, a vertical coordinate is the length (namely, C) of the second data, and a horizontal coordinate is the ratio of bits "1" in the first data. In addition, in FIG. 4, it is assumed that A=256 bits.

It should be noted that FIG. 4 is based on the following assumption: a redundancy degree of data is related to only a ratio of bits "1" in the data, and a ratio of bits "1" in the data closer to 0.5 indicates a lower redundancy degree of the data. However, in actual application, the redundancy degree of the data is not related to only the ratio of bits "1" in the data, but also related to more factors, for example, an organization form of bits "1" and bits "0" in the data, a type of the compression algorithm, and the like. For example, if bits "1" and bits "0" in data each occupy a half of the data and are cycled according to "101010 . . . ", a redundancy degree of the data is great. If bits "1" and bits "0" in data each occupy a half of the data and are randomly distributed, a redundancy degree of the data is low. Therefore, the correspondence between the redundancy degree of the first data and the length of a second data shown in FIG. 4 is merely an example, and does not indicate that a factor for determining the redundancy degree of the first data is limited.

It should be further noted that a ratio of bits "1" in data may refer to a ratio of a quantity of bits "1" in the data to a length of the data. For example, it is assumed that a length of data is 256, and a quantity of bits "1" in the data is 128. In this case, a ratio of bits "1" in the data is 128/256-0.5. A ratio of bits "1" in data may also be referred to as a ratio of bits "1" to the data.

S303: The sending end generates third data based on the second data.

The third data includes the second data and T−C+p alignment bits. T is one of the J thresholds that is greater than or equal to C and is the closest to C. The J thresholds correspond to A, and the J thresholds are greater than 0. J is a positive integer greater than or equal to 2. p is a quantity of auxiliary check bits, and p is an integer greater than or equal to 0.

The following separately describes the T−C+p alignment bits, the p auxiliary check bits, and the J thresholds.

1. T−C+p Alignment Bits

The T−C+p alignment bits may be a sequence for supplementing the length of the second data to T+p. In other words, the T−C+p alignment bits may be added to the second data, and the second data to which the alignment bits are added is the third data. In addition, a length of the third data is T+p. In actual application, the T−C+p alignment bits may be added after the second data or before the second data.

It should be noted that, unless otherwise specified, T in the following may represent a threshold in the J thresholds that is greater than or equal to C and is the closest to C, and p may represent a quantity of auxiliary check bits. Unified descriptions are provided herein, and details are not described below again.

Optionally, the T−C+p alignment bits may be any one of the following: T−C+p check bits, T−C+p repeated bits, T−C+p "0" bits, or T−C+p "1" bits.

Optionally, the T−C+p alignment bits may be for not only supplementing the length of the second data to T+p, but also checking the second data. When the T−C+p alignment bits are further for checking the second data, the T−C+p alignment bits may be a check sequence determined based on the second data. For example, the T−C+p alignment bits may be any one of the following check sequences determined based on the second data: T−C+p cyclic redundancy check (CRC) bits, T−C+p parity check bits, T−C+p repeated bits, or the like. This is not limited in this application.

2. p Auxiliary Check Bits

The p auxiliary check bits may be for checking the second data, where the p auxiliary check bits may be a check sequence determined based on the second data.

When p=0, the third data may include only the second data and T-C alignment bits, and not include an auxiliary check bit.

When p>0, the p auxiliary check bits may improve check performance of the receiving end. When C is close to or even equal to T, a length of T−C+p alignment bits in the third data is at least greater than or equal to p, in other words, there are still at least p bits for checking the second data. In this case, regardless of whether C is close to or even equal to T, there is always at least p bits that may be effectively for checking the second data and that are in the third data, so that the check performance of the receiving end can be improved, and transmission reliability can be improved.

A value of p may be determined by a network device. Within a time period, the value of p may remain unchanged. Certainly, the network device may adjust the value of p based on a requirement. This is not limited in this application.

3. J Thresholds

The J thresholds may be determined by a network device, or determined by a terminal device, or jointly agreed upon by the network device and the terminal device. This is not limited in this application. For an implementation of determining the J thresholds, refer to related descriptions below, for example, a manner 3 or a manner 4. Details are not described herein.

The J thresholds are corresponding to A (to be specific, the length of the first data). In other words, there is a correspondence between A and the J thresholds in the sending end, and the sending end may obtain the J thresholds based on A and the correspondence. The correspondence between the J thresholds and A may be implemented by using a modulation and coding scheme (MCS) table. In other words, the MCS table may include the correspondence between A and the J thresholds.

In some possible embodiments, the J thresholds are variable. In other words, in a process of communication between the sending end and the receiving end, the J thresholds may vary with different communication time. The sending end and the receiving end may adjust the J thresholds based on an agreed rule. For an implementation in which the J thresholds are variable, refer to related descriptions below, for example, a manner 5. Details are not described herein.

Optionally, a maximum threshold in the J thresholds may be a maximum length (denoted as MAX) of the second data. A greater redundancy degree of the first data indicates smaller C. Therefore, C corresponding to a lowest redundancy degree of the first data is MAX. For example, as shown in FIG. 4, A=256 bits, and when a ratio of bits 1 in the first data is 0.5, the redundancy degree of the first data is the lowest. In this case, the first data is compressed into the second data, and the length of the second data is MAX (for example, MAX=256+10=266). It should be noted that, unless otherwise specified, MAX in the following may represent the maximum length of the second data. Similar descriptions are provided herein already, and details are not described below again.

Optionally, transmission of the J thresholds may be performed by using any one of the following signaling: RRC signaling, DCI signaling, MAC CE signaling, or the like. It may be understood that a type of signaling that carries the J thresholds is not limited in this application.

Optionally, the transmission of the J thresholds may be performed through one or more of an uplink physical channel, an uplink data channel, an uplink control channel, a downlink physical channel, a downlink data channel, or a downlink control channel.

In some cases, T may be a threshold in the J thresholds that is greater than C and is the closest to C.

Optionally, the J thresholds correspond to J channel codes, each threshold corresponds to one channel code, and a code rate of each channel code is determined based on a threshold, p, and N that correspond to the channel code. N may be determined by a network device (for example, a base station), and N may correspond to A. For example, when the sending end is a network device, the sending end may determine a length (namely, N) of the third data after channel encoding, for example, determine the length based on a quantity of resources, a quantity of multi-antenna related layers, and a modulation manner that are indicated in scheduling information. In addition, information indicating the length of the third data after channel encoding may be added to the scheduling information sent to a terminal device. When the sending end is a terminal device, the sending end may obtain scheduling information from a network device, and determine, based on an indication of the scheduling information, the length of the third data after channel encoding. The foregoing scheduling information may be scheduling information in DCI. It should be noted that, unless otherwise specified, N in the following may represent a length of data after channel encoding. Similar descriptions are provided herein already, and details are not described below again.

In some possible embodiments, it is assumed that the J thresholds are successively J1, J2, ..., and Jn in ascending order. Ji represents an $i^{th}$ threshold in the J thresholds, and a channel code corresponding to Ji is determined based on Ji, p, and N, where i is a positive integer, and i≤n. For example, for channel codes corresponding to J1, J2, ..., and Jn−1, a code rate is (Jk+p)/N, and a code length is N, where k is a positive integer, and k≤n−1. A code rate of a channel code corresponding to Jn is A/N or (Jn+p)/N. The channel code corresponding to Jn depends on whether the sending end sends, to the receiving end, first information indicating T. In other words, when the sending end and the receiving end communicate by using the following communication method shown in FIG. 6, the code rate of the channel code corresponding to Jn is (Jn+p)/N. When the sending end and the receiving end communicate by using the following communication method shown in FIG. 9, the code rate of the channel code corresponding to Jn is A/N.

In some possible embodiments, a correspondence between the J thresholds and the J channel codes may be implemented by using the MCS table. In other words, the MCS table may include the correspondence between the J thresholds and the J channel codes. In this case, when performing the communication method provided in this application, the sending end and the receiving end may determine, by searching the correspondence in the MCS table, the channel codes corresponding to the J thresholds, and there is no need to indicate the channel codes corresponding to the J thresholds by using signaling, so that signaling overheads can be saved.

In some possible embodiments, for each possible A, the MCS table may include the J thresholds corresponding to each possible A and the J channel codes corresponding to the J thresholds.

In some possible embodiments, the sending end may send second information to the receiving end, where the second information indicates the correspondence between the J thresholds and the J channel codes.

The foregoing describes the T−C+p alignment bits, the J thresholds, and the p auxiliary check bits. The following describes an implementation of S303 in detail with reference to the descriptions.

In some possible embodiments, an implementation of S303 in which the sending end generates the third data based on the second data may include a manner 1 and a manner 2.

In the manner 1, the sending end may supplement the length of the second data to T+p by using the T−C+p alignment bits, and supplemented second data is the third data. In addition, the T−C+p alignment bits are a check sequence determined based on the second data. In other words, the T−C+p alignment bits are a check sequence (which is also referred to as check data) of the second data.

In the manner 2, it is assumed that the J thresholds are successively $J_1, J_2, \ldots,$ and $J_n$ in ascending order. To be specific, $J_n$ is a maximum threshold of the J thresholds, and $J_{n-1}$ is a threshold that is less than only $J_n$ in the J thresholds. When $C \leq J_{n-1}$, the sending end may supplement the length of the second data to T by using T-C alignment bit, and supplemented second data is the third data. When $C > J_{n-1}$, the sending end may update the first data to the second data, and determine the second data as the third data. In addition, in the manner 2, the sending end further sends first information to the receiving end, where the first information corresponds to T.

Figure 6:
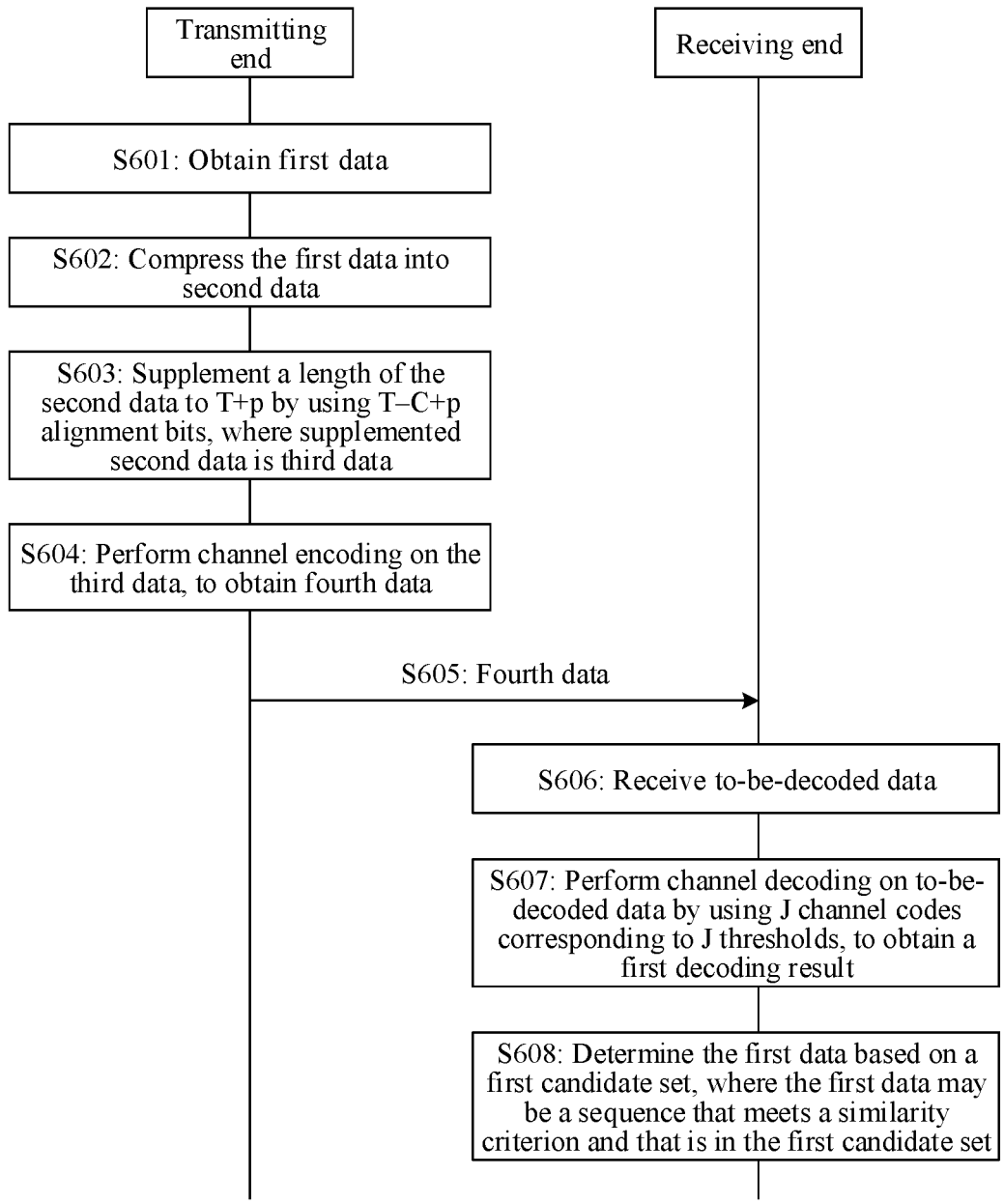
FIG. 6 is a schematic flowchart 2 of a communication method according to an embodiment of this application.

For a more detailed implementation of the manner 1, refer to S603 in FIG. 6. For a more detailed implementation of the manner 2, refer to S903 in FIG. 9. Details are not described herein.

In the foregoing descriptions of S302 and S303, the second data may be considered as data obtained by compressing the first data, and the third data may be considered as data obtained by aligning (or supplementing) of the second data. Therefore, the third data may be considered as data obtained by compressing and aligning the first data. In addition, the length of the third data is related to the redundancy degree of the first data. If the redundancy degree of the first data is greater, the length of the third data is smaller.

Figure 5:
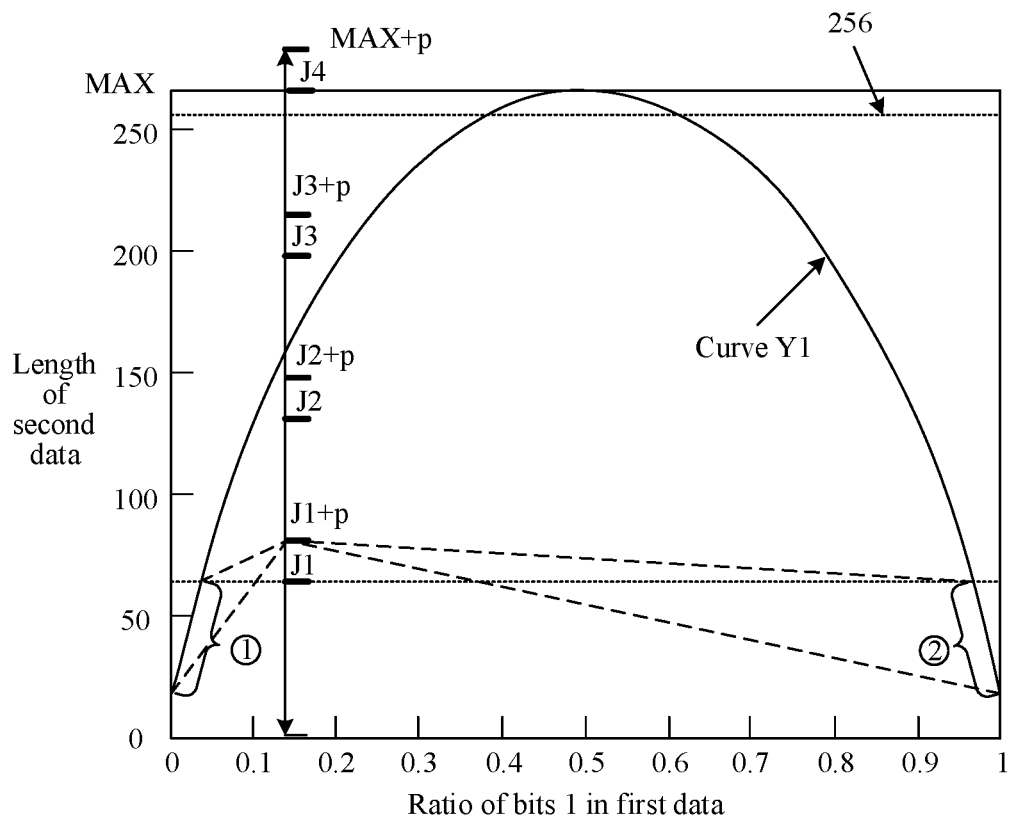
FIG. 5 is a schematic diagram of compression of first data according to an embodiment of this application.

For example, as shown in FIG. 5, it is assumed that J=4, J thresholds are successively $J_1, J_2, J_3,$ and $J_4$ in ascending order, a range between two adjacent thresholds may be referred to as an interval, and an interval may be formed between J1 and 0. In other words, interval division may be performed on $J_1, J_2, J_3,$ and $J_4$ to form four intervals, which are respectively $[0, J_1], (J_1, J_2], (J_2, J_3],$ and $(J_3, J_4]$. A curve Y1 in FIG. 5 represents lengths that are of the second data and that correspond to the first data with different redundancy degrees. When the length of the second data is in the interval $[0, J_1]$, after the second data is aligned with the third data, the length of the third data is $J_1+p$. In other words, all possible Cs shown by a curve segment ① and a curve segment ② on the curve Y1 in FIG. 5, and corresponding third data lengths are $J_1+p$. By analogy, when lengths of the second data are respectively located in $(J_1, J_2], (J_2, J_3],$ and $(J_3, J_4]$, lengths of the third data corresponding to the second data are respectively $J_2+p, J_3+p,$ and $J_4+p$. After the foregoing operations performed on the first data in S302 and S303, if the redundancy degree of the first data is greater, the length of the third data is smaller.

In some cases, if T is a threshold in the J thresholds that is greater than C and is the closest to C, in FIG. 5, the four intervals formed when interval division is performed on $J_1, J_2, J_3,$ and $J_4$ may include: $[0, J_1). [J_1, J_2), [J_2, J_3),$ and $[J_3, J_4]$. When the length of the second data is in the interval $[0, J_1)$, after the second data is aligned with the third data, the length of the third data is $J_1+p$. By analogy, when lengths of the second data are respectively located in $[J_1, J_2), [J_2, J_3),$ and $[J_3, J_4]$, lengths of the third data corresponding to the second data are respectively $J_2+p, J_3+p,$ and $J_4+p$. It may be understood that a manner of interval division shown in FIG. 5 is merely an example, and the manner of interval division of the J thresholds is not limited in this application.

S304: The sending end performs channel encoding on the third data, to obtain fourth data.

When performing channel encoding on the third data, the sending end may determine, based on the length (denoted as L) of the third data, a channel code corresponding to the third data, and then perform channel encoding on the third data by using the channel code corresponding to the third data, to obtain the fourth data.

A code rate of a channel code corresponding to the third data is L/N, where N is a data length after channel encoding, in other words, a code length.

In some possible embodiments, when performing channel encoding on the third data, the sending end may perform channel encoding on the third data based on a channel code corresponding to T, to obtain the fourth data.

Figure 9:
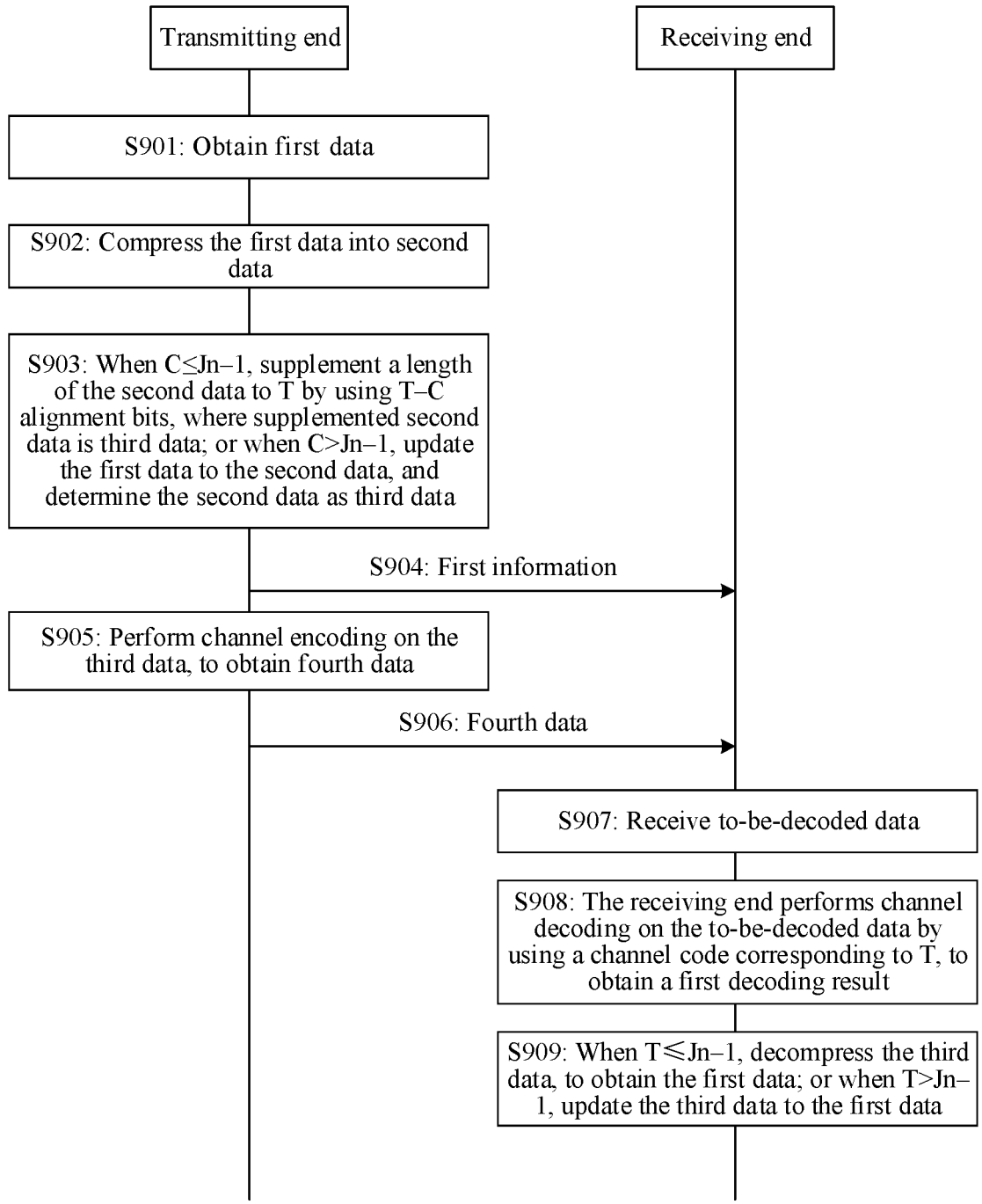
FIG. 9 is a schematic flowchart 3 of a communication method according to an embodiment of this application.

For a more detailed implementation of performing channel encoding on the third data to obtain the fourth data in S304, refer to S604 shown in FIG. 6 or S905 shown in FIG. 9. Details are not described herein.

In some possible embodiments, in S304, when performing channel encoding on the third data, the sending end may add, to the third data, a CRC check sequence determined based on the third data, and then perform channel encoding on the third data to which the CRC check sequence is added, to obtain the fourth data. Correspondingly, when performing channel decoding on to-be-decoded data, the receiving end may obtain a CRC check sequence from decoded data, and check the decoded data, to determine whether the data is valid.

In some possible embodiments, the first data in the foregoing S301 may include the to-be-transmitted data and a CRC check sequence determined based on the to-be-transmitted data. In this case, in the foregoing S304, when performing channel encoding on the third data, the sending end may perform channel encoding on the third data, but does not add, to the third data, the CRC check sequence determined based on the third data. Correspondingly, the receiving end may perform channel decoding on the to-be-decoded data, decompress the data, obtain a CRC check sequence from decompressed data (such as the first data), and check the decompressed data, to determine whether the data is valid.

It should be noted that, in the foregoing S302, compressing the first data into the second data may be referred to as a "compression" process for short. In the foregoing S303, generating the third data based on the second data may be referred to as an "alignment" or "supplement" process for short. In the foregoing S304, performing channel encoding on the third data to obtain the fourth data may be referred to as a "channel encoding" process for short.

S305: The sending end sends the fourth data to the receiving end.

For example, the sending end may perform operations such as modulation and resource mapping on the fourth data before sending the fourth data to the receiving end.

Optionally, the fourth data may be transmitted through one or more of an uplink physical channel, an uplink data channel, an uplink control channel, a downlink physical channel, a downlink data channel, or a downlink control channel. It may be understood that a type of a channel that carries the fourth data is not limited in this application.

S306: The receiving end receives to-be-decoded data from the sending end.

The to-be-decoded data corresponds to N, and N corresponds to A. The to-be-decoded data is data that carries the fourth data. A length of the fourth data is N, where N corresponds to A, a correspondence between N and A may be indicated by scheduling information (for example, scheduling information in DCI), and the receiving end may determine N and A based on an indication of the scheduling information. For related descriptions of N and A, refer to the foregoing descriptions. Details are not described herein again.

In S305, the data sent by the sending end is the data obtained by performing operations such as modulation and resource mapping on the fourth data. The data obtained by performing operations such as modulation and resource mapping on the fourth data is referred to as fifth data below. Correspondingly, when receiving the fifth data from the sending end, the receiving end needs to perform operations such as resource demapping and demodulation on the fifth data, to obtain the to-be-decoded data, where the to-be-decoded data includes the fourth data.

S307: The receiving end performs channel decoding on the to-be-decoded data, to obtain a first decoding result, where the first decoding result includes third data.

The third data includes second data and T−C+p alignment bits. T is one of the J thresholds that is greater than or equal to C and the closest to C. The J thresholds correspond to A, and the J thresholds are greater than 0. J is a positive integer greater than or equal to 2. C is a length of the second data, and C is a positive integer. p is a quantity of auxiliary check bits, and p is an integer greater than or equal to 0.

For related descriptions of the T−C+p alignment bits, the J thresholds, and the p auxiliary check bits, refer to the foregoing descriptions. Details are not described herein again. It should be noted that, because the correspondence between the J thresholds and the J channel codes and the correspondence between the J thresholds and A may be implemented by using an MCS table, and N corresponds to A, the receiving end may obtain the J thresholds, the J channel codes corresponding to the J thresholds, A, and N based on the MCS table and scheduling information.

It may be understood that, in a process of sending the first data to the receiving end, the sending end may perform compression, alignment, and channel encoding on the first data, to obtain the fourth data, and then send the fourth data to the receiving end (referring to the foregoing S301 to S304). Therefore, the third data included in the first decoding result obtained by the receiving end includes the second data obtained by compressing the first data. In other words, the second data included in the third data is obtained by compressing the first data.

In S307, for a more detailed implementation in which the receiving end performs channel decoding on the to-be-decoded data, to obtain the first decoding result, refer to S607 shown in FIG. 6 or S908 shown in FIG. 9. Details are not described herein.

In some possible embodiments, if the sending end performs channel encoding on the third data to which a CRC check sequence is added, to obtain the fourth data, the receiving end performs channel encoding on the to-be-decoded data that carries the fourth data, and the obtained first decoding result may include the CRC check sequence and the third data. In this case, the receiving end may further check the third data by using the CRC check sequence, to determine whether there is an error in the third data.

In some possible embodiments, if the sending end does not add, to the third data, a CRC check sequence determined based on the third data, but adds, to the first data, a CRC check sequence determined based on the first data, when the receiving end performs channel decoding on the to-be-decoded data that carries the fourth data, the obtained first decoding result includes third data. In this case, the receiving end needs to check the first data by using the CRC check sequence in the first data obtained based on the third data, to determine whether there is an error in the first data.

S308: The receiving end determines the first data based on the third data.

The length of the first data is A.

In S308, for a more detailed implementation in which the receiving end determines the first data based on the third data, refer to S608 shown in FIG. 6 or S909 shown in FIG. 9. Details are not described herein again.

The following describes in detail a communication method provided in an embodiment of this application with reference to an example.

For example, FIG. 6 is a schematic flowchart 2 of a communication method according to an embodiment of this application. The communication method is applicable to the communication system shown in FIG. 1, to implement the communication method shown in FIG. 3.

As shown in FIG. 6, the communication method includes S601 to S608.

S601: A sending end obtains first data.

S602: The sending end compresses the first data into second data.

S603: The sending end supplements a length of the second data to T+p by using T-C+p alignment bits, where supplemented second data is third data.

In some possible embodiments, S603 in which the sending end supplements a length of the second data to T+p by using T−C+p alignment bits, where supplemented second data is third data may include the following step 1 to step 3.

Step 1: The sending end determines, based on C, T in J thresholds, where T is a threshold in the J thresholds that is greater than or equal to C and closest to C.

Step 2: The sending end determines a check sequence of the second data by using a check algorithm, where the check sequence includes the T−C+p aligned bits. The check algorithm may be but is not limited to a parity check algorithm, a CRC check algorithm, or the like.

Step 3: The sending end adds the T−C+p alignment bits to an end of the second data, and determines the second data to which the T−C+p alignment bits are added as the third data.

Figure 7:
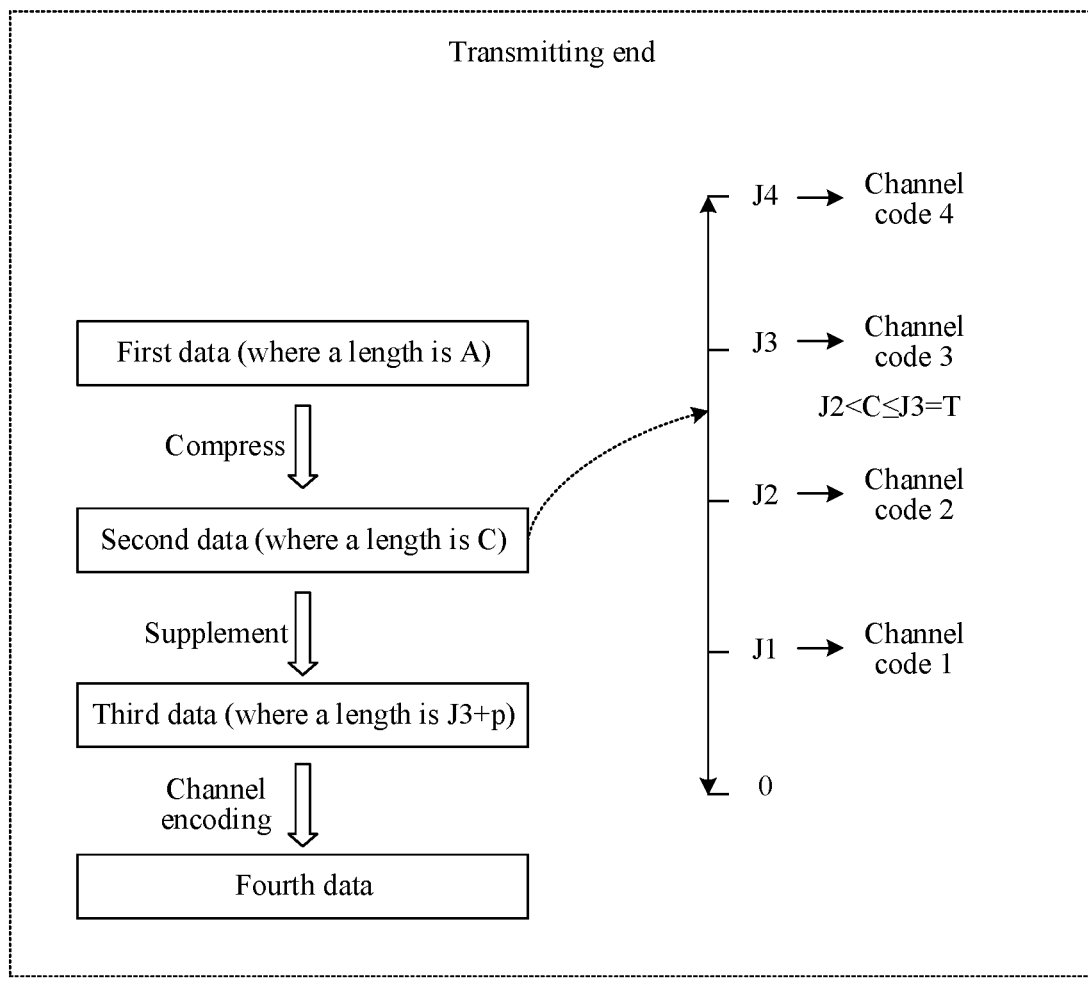
FIG. 7 is a schematic diagram 1 of generating fourth data by a sending end according to an embodiment of this application.

For example, FIG. 7 is a schematic diagram 1 of generating fourth data by a sending end according to an embodiment of this application. In FIG. 7, J=4, and the J thresholds are successively $J_1$, $J_2$, $J_3$, and $J_4$ in ascending order, where $J_2<C \leq J_3$. As shown in FIG. 7, the sending end first determines $T=J_3$ based on $J_2<C \leq J_3$, and then generates, by using the check algorithm, $J_3-C+p$ alignment bits (in other words, the check sequence of the second data) corresponding to the second data. The $J_3$-C+p alignment bits are added to the end of the second data, and the second data to which the alignment bits are added is the third data.

It should be noted that "compress" in the accompanying drawings (as shown in FIG. 7) provided in this application refers to "compress first data into second data", "supplement" refers to "generate the third data based on the second data", and "perform channel encoding" refers to "perform channel encoding on the third data". Unified descriptions are provided herein, and details are not described below again.

S604: The sending end performs channel encoding on the third data, to obtain fourth data.

For example, in FIG. 7, channel codes respectively corresponding to $J_1$, $J_2$, $J_3$, and $J_4$ are a channel code 1, a channel code 2, a channel code 3, and a channel code 4. For a manner of determining a channel code corresponding to each threshold, refer to the descriptions of "J thresholds" in S303. Details are not described herein again. Because T=$J_3$, channel encoding may be performed on the third data by using the channel code 3 corresponding to $J_3$, to obtain the fourth data. Alternatively, a channel code may be determined based on a length $J_3$+p of the third data, where a code rate of the channel code is ($J_3$+p)/N, and a code length is N, and then channel encoding is performed on the third data by using the channel code, to obtain the fourth data.

S605: The sending end sends the fourth data to the receiving end.

S606: The receiving end receives to-be-decoded data from the sending end.

S607: The receiving end performs channel decoding on the to-be-decoded data by using J channel codes corresponding to the J thresholds, to obtain a first decoding result.

The first decoding result includes J first sequences, and the J first sequences include the third data.

Figure 8:
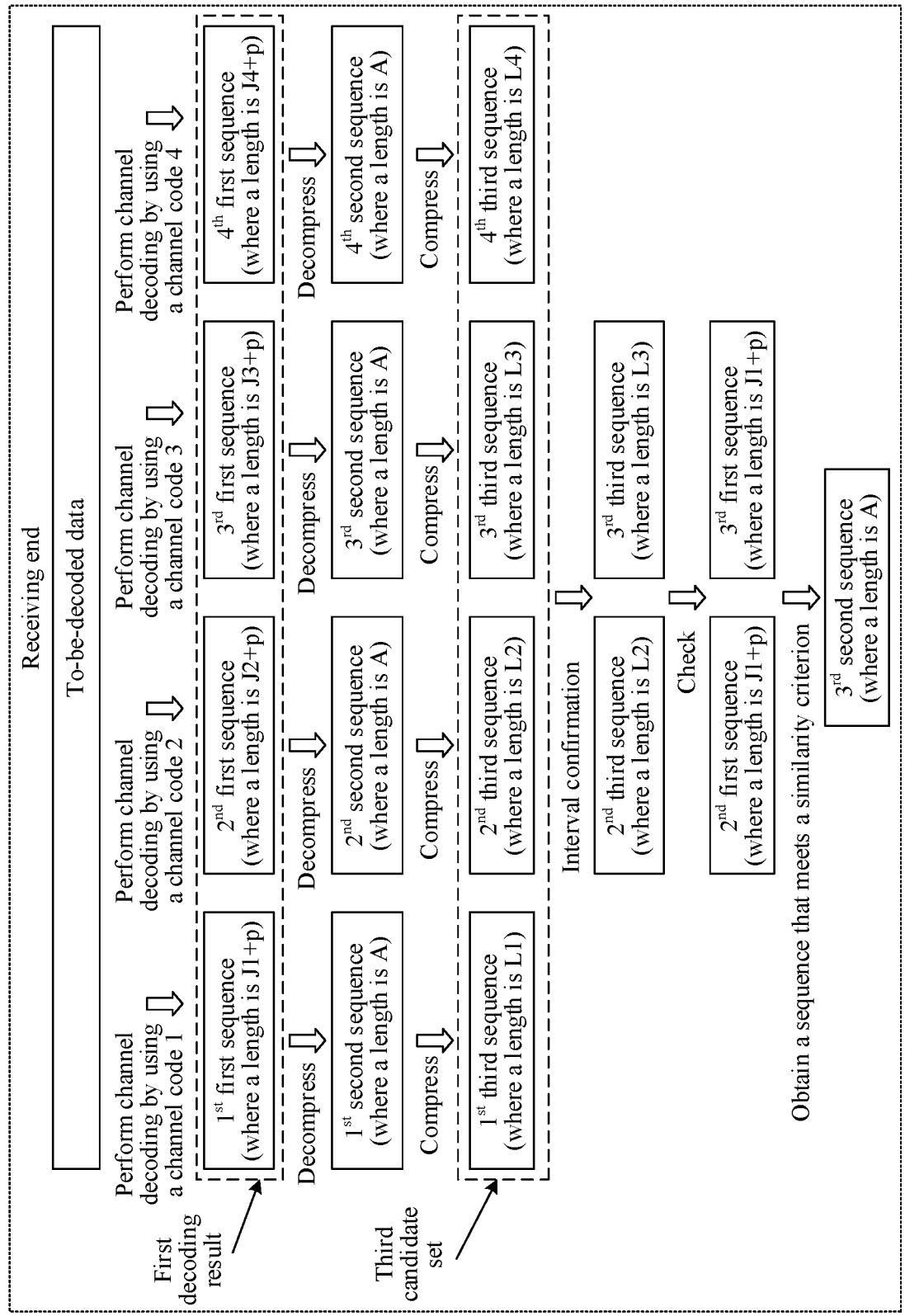
FIG. 8 is a schematic diagram 1 of performing channel decoding on to-be-decoded data by a receiving end according to an embodiment of this application.

For example, FIG. 8 is a schematic diagram 1 of performing channel decoding on to-be-decoded data by a receiving end according to an embodiment of this application. In FIG. 8, J=4, and J thresholds are successively $J_1$, $J_2$, $J_3$, and $J_4$ in ascending order. The J channel codes corresponding to the J thresholds are respectively a channel code 1, a channel code 2, a channel code 3, and a channel code 4. Code rates of the channel code 1, the channel code 2, the channel code 3, and the channel code 4 are successively ($J_1$+p)/N, ($J_2$+p)/N, ($J_3$+p)/N, and ($J_4$+p)/N, where code lengths of the channel codes are all N.

As shown in FIG. 8, the receiving end may separately perform channel decoding on the to-be-decoded data by using the channel code 1 to the channel code 4, to obtain four first sequences, which are successively the $1^{st}$ first sequence, the $2^{nd}$ first sequence, the $3^{rd}$ first sequence, and the $4^{th}$ first sequence. Lengths of the four first sequences are successively $J_1$+p, $J_2$+p, $J_3$+p, and $J_4$+p.

It may be understood that a reason why the receiving end performs S607 is that the sending end does not send an indication about T to the receiving end, in other words, the receiving end does not obtain a bit rate that is of a channel code and that is used when the sending end performs channel encoding on the fourth data. Therefore, blind detection needs to be performed on the to-be-decoded data to obtain the first data, in other words, channel decoding is performed on the to-be-decoded data by using all possible channel codes (to be specific, the J channel codes corresponding to the J thresholds), and the obtained first decoding result (for example, the foregoing four first sequences) includes the third data. Then, the first data is determined from the four first sequences by performing the following S608.

In some possible embodiments, if the sending end performs channel encoding on the third data to which a CRC check sequence is added, to obtain the fourth data, the data obtained by performing channel decoding on the to-be-decoded data received by the receiving end may include CRC check data and the third data. In this case, the receiving end may perform channel decoding on the to-be-decoded data by using the J channel codes corresponding to the J thresholds, to obtain J decoding results, check the decoding result by using CRC check data in each decoding result, and determine a decoding result that passes a check as the first decoding result. For example, as shown in FIG. 8, the receiving end separately performs channel decoding on the to-be-decoded data by using the channel code 1 to the channel code 4, to obtain four first sequences, where the four first sequences are successively the $1^{st}$ first sequence, the $2^{nd}$ first sequence, the $3^{rd}$ first sequence, and the $4^{th}$ first sequence. Then, the receiving end may check the first sequence by using CRC check data in the first sequence, for example, check the $2^{nd}$ first sequence by using CRC check data in the $2^{nd}$ first sequence. It is assumed that first sequences that pass the check are respectively the $2^{nd}$ first sequence and the $3^{rd}$ first sequence. In this case, the first decoding result includes the $2^{nd}$ first sequence and the $3^{rd}$ first sequence, and the third data may be the $2^{nd}$ first sequence or the $3^{rd}$ first sequence.

S608: Determine the first data based on a first candidate set, where the first data may be a sequence that meets a similarity criterion in the first candidate set.

In some possible embodiments, S608 in which the determining of the first data based on a first candidate set, where the first data may be a sequence that meets a similarity criterion in the first candidate set, may include the following step 4 to step 7.

Step 4: Obtain a third candidate set, where the third candidate set includes J candidate results obtained by decompressing and compressing the first decoding result based on the J thresholds.

Step 5: Obtain a second candidate set based on the third candidate set, where the second candidate set includes X2 candidate results that pass interval confirmation and that are in the J candidate results of the third candidate set.

Step 6: Obtain the first candidate set based on the second candidate set, where the first candidate set includes X1 candidate results that pass a check and that are in the X2 candidate results of the second candidate set.

Step 7: Determine the first data based on the first candidate set, where the first data may be the sequence that meets the similarity criterion in the first candidate set.

The following separately describes the first candidate set, the second candidate set, and the third candidate set.

1. Third Candidate Set

The third candidate set includes the J candidate results obtained by decompressing and compressing the first decoding result based on the J thresholds.

The J candidate results obtained by decompressing and compressing the first decoding result based on the J thresholds refers to: performing channel decoding on the to-be-decoded data by using the J channel codes corresponding to the J thresholds, to obtain the J first sequences; then, decompressing the J first sequences, to obtain J second sequences; finally, compressing the J second sequences, to obtain J third sequences, where the J third sequences are a set of the J candidate results, namely, the third candidate set.

For example, as shown in FIG. 8, after channel decoding is performed on the to-be-decoded data by using the channel code 1 to the channel code 4, the four first sequences are obtained. The four first sequences are decompressed to obtain four second sequences, and a length of each second sequence is A. The four second sequences are compressed to obtain four third sequences, and the four third sequences are the third candidate set. If a decompression algorithm and a compression algorithm used by the sending end and the receiving end are online arithmetic codes, a process of decompressing the first sequence to obtain the second sequence may be: decoding the first sequence by using the online arithmetic code, to obtain first A bits output by using the online arithmetic code, where the A bits are the second sequence.

2. Second Candidate Set

The second candidate set includes the X2 candidate results that pass interval confirmation and that are in the J candidate results in the third candidate set.

When all candidate results in the third candidate set are sorted in ascending order based on values of thresholds corresponding to the candidate results in the J thresholds, the interval confirmation refers to: determining whether the $i^{th}$ candidate result in the third candidate set meets a first condition, where the first condition is that a length is less than or equal to a threshold corresponding to the $i^{th}$ candidate result, and is greater than a threshold corresponding to the $(i-1)^{th}$ candidate result. If the $i^{th}$ candidate result meets the first condition, it is determined that the $i^{th}$ candidate result passes the interval confirmation. If the $i^{th}$ candidate result does not meet the first condition, it is determined that the $i^{th}$ candidate result fails to pass the interval confirmation. It should be noted that, when it is determined whether the $1^{st}$ candidate result in the third candidate set meets the first condition, the first condition that a length is less than or equal to a threshold corresponding to the $1^{st}$ candidate result, and is greater than 0.

For example, as shown in FIG. 8, lengths of the $1^{st}$ third sequence to the 4th third sequence are successively $L_1$, $L_2$, $L_3$, and $L_4$. Thresholds corresponding to the $1^{st}$ third sequence to the 4th third sequence are respectively $J_1$, $J_2$, $J_3$, and $J_4$. It is assumed that $L_1 \geq J_1$, $J_1 < L_2 \leq J_1$, $J_2 < L_3 \leq J_2$, and $J_2 < L_4 \leq J_2$. In this case, it may be determined that the $2^{nd}$ third sequence and the $3^{rd}$ third sequence pass the interval confirmation. Therefore, it is determined that the X2 candidate results that pass the interval confirmation and that are in the J candidate results in the third candidate set include the $2^{nd}$ third sequence and the $3^{rd}$ third sequence, in other words, the second candidate set includes the $2^{nd}$ third sequence and the $3^{rd}$ third sequence.

In some possible embodiments, if the second candidate set includes only one candidate result, decompressed data corresponding to the candidate result is the first data. In this case, the receiving end may determine the decompressed data corresponding to the candidate result as the first data, and the following steps (for example, step 6 and step 7) are not performed. For example, as shown in FIG. 8, it is assumed that the second candidate set includes only the $2^{nd}$ third sequence. In this case, decompressed data (the $2^{nd}$ second sequence) corresponding to the $2^{nd}$ third sequence is the first data.

3. First Candidate Set

The first candidate set includes the X1 candidate results that pass the check and that are in the X2 candidate results of the second candidate set.

The check refers to: determining whether a check on the $i^{th}$ candidate result in the second candidate set is correct. If the check on the $i^{th}$ candidate result is correct, it is determined that the candidate result passes the check. If the check on the $i^{th}$ candidate result is incorrect, it is determined that the candidate result fails to pass the check.

For example, as shown in FIG. 8, it is assumed that both the $2^{nd}$ third sequence and the $3^{rd}$ third sequence pass the check. In this case, the X1 candidate results that pass the check and that are in the X2 candidate results of the second candidate set include the $2^{nd}$ third sequence and the $3^{rd}$ third sequence, in other words, the first candidate set includes the $2^{nd}$ third sequence and the $3^{rd}$ third sequence.

In some cases, there may be only one third sequence that passes the check. In this case, the first data is a second sequence corresponding to the third sequence that passes the check. As shown in FIG. 8, it is assumed that only the $3^{rd}$ third sequence passes the check. In this case, the $3^{rd}$ second sequence corresponding to the $3^{rd}$ third sequence is the first data. In this way, similarity criterion determining does not need to be performed, and decoding performance is improved.

In some cases, if there are a plurality of third sequences that pass the check, accurate similarity determining further needs to be performed. The similarity criterion determination refers to: performing channel encoding on a first sequence corresponding to the $i^{th}$ candidate result in the first candidate set, to obtain the $i^{th}$ fourth sequence, and determining a similarity between the $i^{th}$ fourth sequence and the to-be-decoded data, where a second sequence corresponding to a fourth sequence with the highest similarity is the first data.

For example, as shown in FIG. 8, it is assumed that the first candidate set includes the $2^{nd}$ third sequence and the $3^{rd}$ third sequence, and first sequences respectively corresponding to the $2^{nd}$ third sequence and the $3^{rd}$ third sequence are the $2^{nd}$ first sequence and the $3^{rd}$ first sequence. In this case, the receiving end may perform channel encoding on the $2^{nd}$ first sequence and the $3^{rd}$ first sequence, to obtain the $2^{nd}$ fourth sequence and the $3^{rd}$ fourth sequence. Then, a similarity between the $2^{nd}$ fourth sequence and the $3^{rd}$ fourth sequence and the to-be-decoded data is separately determined. Finally, a second sequence corresponding to the fourth sequence with highest similarity is determined as the first data. For example, it is assumed that the similarity between the $2^{nd}$ fourth sequence and the to-be-decoded data is the highest. In this case, the receiving end may determine the $2^{nd}$ second sequence as the first data.

A process of determining similarity between a fourth sequence and the to-be-decoded data may be: obtaining a conditional probability of the fourth sequence when the to-be-decoded data is known. The conditional probability may be calculated based on a value of the fourth sequence and a likelihood ratio of each bit of the fourth sequence, and the likelihood ratio of the bit may be demodulated and obtained by the receiving end.

In brief, the first data may be a sequence that meets the similarity criterion and that is in the first candidate set. The first candidate set includes the X1 candidate results that pass the check and that are in the X2 candidate results in the second candidate set. The second candidate set includes the X2 candidate results that pass the interval confirmation and that are in the J candidate results in the third candidate set. The third candidate set includes the J candidate results obtained by decompressing and compressing the first decoding result based on the J thresholds.

In some other possible embodiments, in S608, the determining of the first data based on a first candidate set, where the first data may be a sequence that meets a similarity criterion in the first candidate set, may include the following step 8 and step 9.

Step 8: Decompress the $i^{th}$ first sequence in the J first sequences to the $i^{th}$ second sequence. A length of the $i^{th}$ second sequence is A, where i is a positive integer, and i≤J.

Step 9: Verify the $i^{th}$ first sequence based on the $i^{th}$ second sequence. If the $i^{th}$ first sequence passes the verification, the $i^{th}$ second sequence is the first data.

The verifying the $i^{th}$ first sequence based on the $i^{th}$ second sequence may include: compressing the $i^{th}$ second sequence into the $i^{th}$ third sequence by using an arithmetic code; obtaining check data in the $i^{th}$ first sequence based on a length of the $i^{th}$ third sequence; and verifying the $i^{th}$ first sequence by using the check data in the $i^{th}$ first sequence. If the $i^{th}$ first sequence passes the verification, it is determined that the $i^{th}$ second sequence is the first data.

Before obtaining check data in the $i^{th}$ first sequence based on a length of the $i^{th}$ third sequence, the verifying of the $i^{th}$ first sequence based on the $i^{th}$ second sequence may further include: if the length of the $i^{th}$ third sequence is greater than or equal to a threshold that corresponds to the $i^{th}$ first sequence and that is in the J thresholds, or the length of the $i^{th}$ third sequence is less than a threshold that corresponds to the $(i-1)^{th}$ first sequence and that is in the J thresholds, it is determined that the $i^{th}$ first sequence fails the verification.

If there are a plurality of first sequences that pass the verification, the verifying of the $i^{th}$ first sequence based on the $i^{th}$ second sequence may further include: perform channel encoding on the plurality of first sequences that pass the verification, to obtain a plurality of fourth sequences; obtain similarity between each fourth sequence and the to-be-decoded data; and determine a second sequence corresponding to a fourth sequence with the highest similarity as the first data.

It may be understood that, in S601 to S608, the sending end does not need to send the first information to the receiving end, so that signaling overheads can be reduced. In this case, the sending end and the receiving end may be used for uplink transmission, or may be used for downlink transmission. The foregoing process of S607 and S608 may be referred to as performing blind detection on the to-be-decoded data to obtain the first data.

It should be noted that, for S601, S602, S604, S605, and S606 in the communication method shown in FIG. 6, refer to S301, S302, S304, S305, and S306 in the communication method shown in FIG. 3. Details are not described herein again.

For example, FIG. 9 is a schematic flowchart 3 of a communication method according to an embodiment of this application. The communication method is applicable to the communication system shown in FIG. 1, to implement the communication method shown in FIG. 3.

As shown in FIG. 9, the communication method includes S901 to S909.

S901: A sending end obtains first data.

S902: Compress the first data into second data.

S903: When C≤Jn−1, the sending end supplements a length of the second data to T by using T-C alignment bits, where supplemented second data is third data. When C>Jn−1, the sending end updates the first data to the second data, and determine the second data as third data. It is assumed that J thresholds are successively $J_1, J_2, \ldots,$ and Jn in ascending order, to be specific, Jn is a maximum threshold of the J thresholds, and Jn−1 is a threshold that is less than only Jn in the J thresholds.

In some possible embodiments, S903 may include the following step 10 to step 12.

Step 10: The sending end determines, based on C, T in J thresholds, where T is a threshold in the J thresholds that is greater than or equal to C and closest to C.

Step 11: The sending end determines whether C is greater than Jn−1. Jn−1 is a threshold that is in the J thresholds and that is less than only the maximum threshold in the J thresholds.

Step 12: When C≤Jn−1, the sending end adds T-C alignment bits to an end of the second data, and determines second data to which the T-C alignment bits are added as the third data. When C>Jn−1, the sending end updates the first data to the second data, and determines the second data as the third data.

The T-C alignment bits may be T-C bits "0", T-C bits 1, T-C bits that are randomly generated, or the like, or may be T-C CRC bits, T-C parity check bits, T-C repeated bits, or the like that is generated based on the second data. This is not limited in this application.

Figure 10:
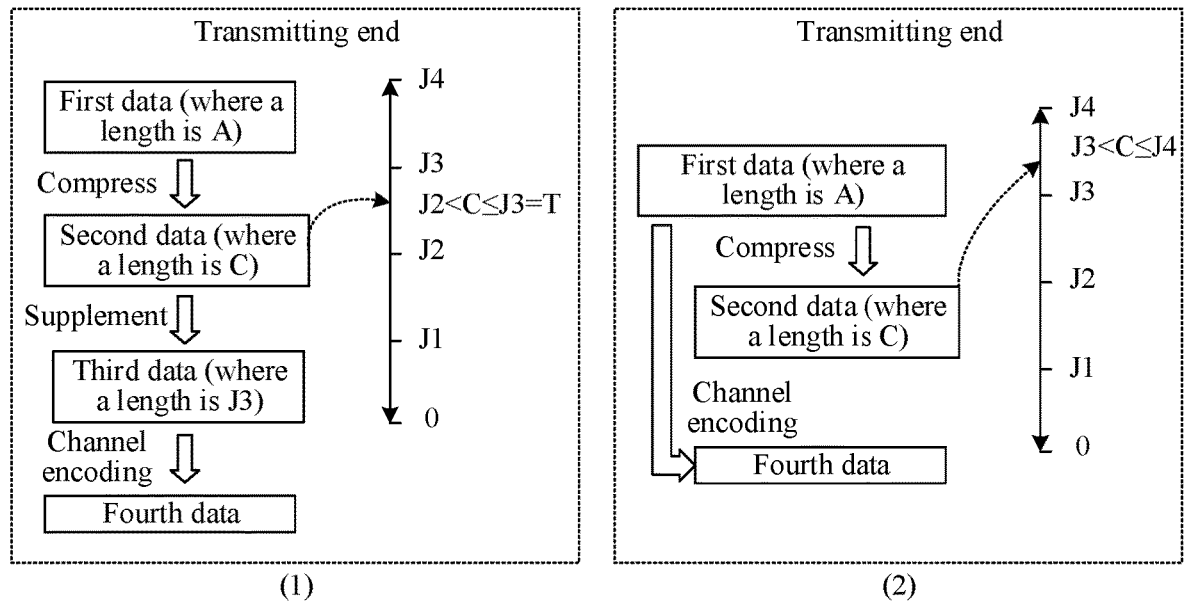
FIG. 10 is a schematic diagram 2 of generating fourth data by a sending end according to an embodiment of this application.

For example, FIG. 10 is a schematic diagram 2 of generating fourth data by the sending end according to an embodiment of this application. In FIG. 10, it is assumed that J=4, p=0. In this case, the J thresholds are successively $J_1, J_2, J_3,$ and $J_4$ in ascending order. As shown in (1) in FIG. 10, when $J_2<C\leq J_3$, the sending end first determines $T=J_3$ based on $J_2<C\leq J_3$, generates $J_3$-C alignment bits, and adds the $J_3$-C alignment bits to the end of second data. Second data to which the alignment bits are added is the third data. As shown in (2) in FIG. 10, when $C>J_3$, the sending end first determines $T=J_4$ based on $C>J_3$. Then, the sending end updates the first data to the second data, and determines the second data as the third data. In other words, when $C>J_{n-1}$, the sending end may update the first data to the third data.

S904: The sending end sends first information to a receiving end.

Correspondingly, the receiving end receives the first information from the sending end, where the first information corresponds to T.

The first information is carried in control signaling, for example, may be included in DCI. That the first information corresponds to T may be understood as that the first information indicates T. A length of the first information may be determined based on a quantity of J thresholds. For example, the length of the first information may be greater than or equal to $\lceil \log_2 J \rceil$, where $\lceil \ \rceil$ is a ceiling symbol.

For example, as shown in (1) in FIG. 10, when $J_2<C\leq J_3$, the sending end determines $T=J_3$ based on $J_2<C\leq J_3$, and the sending end may send, to the receiving end, first information indicating that $T=J_3$. For another example, as shown in (2) in FIG. 10, when $C>J_3$, the sending end determines that $T=J_4$ based on $C>J_3$, and the sending end may send, to the receiving end, the first information indicating that $T-J_4$.

S905: The sending end performs channel encoding on the third data, to obtain fourth data.

For example, as shown in (1) in FIG. 10, because $J_2<C\leq J_3$, the third data is the second data to which $J_3$-C alignment bits are added. In other words, a length of the third data is $J_3$, and a code rate of a corresponding channel code is $J_3/N$. The sending end may perform channel encoding on the third data by using the channel code, to obtain the fourth data.

For another example, as shown in (2) in FIG. 10, because $J_3<C\leq J_4$, the sending end updates the first data to the third data. In other words, the sending end may perform channel encoding on the first data, to obtain the fourth data.

S906: The sending end sends the fourth data to the receiving end.

It should be noted that a performing sequence of S904, S905, and S906 is not limited in this application. S904 may be performed after S905, or may be performed after S906.

S907: The receiving end receives to-be-decoded data from the sending end.

S908: The receiving end performs channel decoding on the to-be-decoded data by using a channel code corresponding to T, to obtain a first decoding result, where the first decoding result is the third data.

The receiving end may obtain, based on an MCS table and scheduling information, the J thresholds, J channel codes corresponding to the J thresholds, and A and N, so that the receiving end may determine, based on T, the channel code corresponding to T, in other words, a channel code used by the sending end in J channel codes corresponding to the J thresholds, and perform channel decoding on the to-be-decoded data based on the channel code corresponding to T, to obtain the first decoding result.

Figure 11:
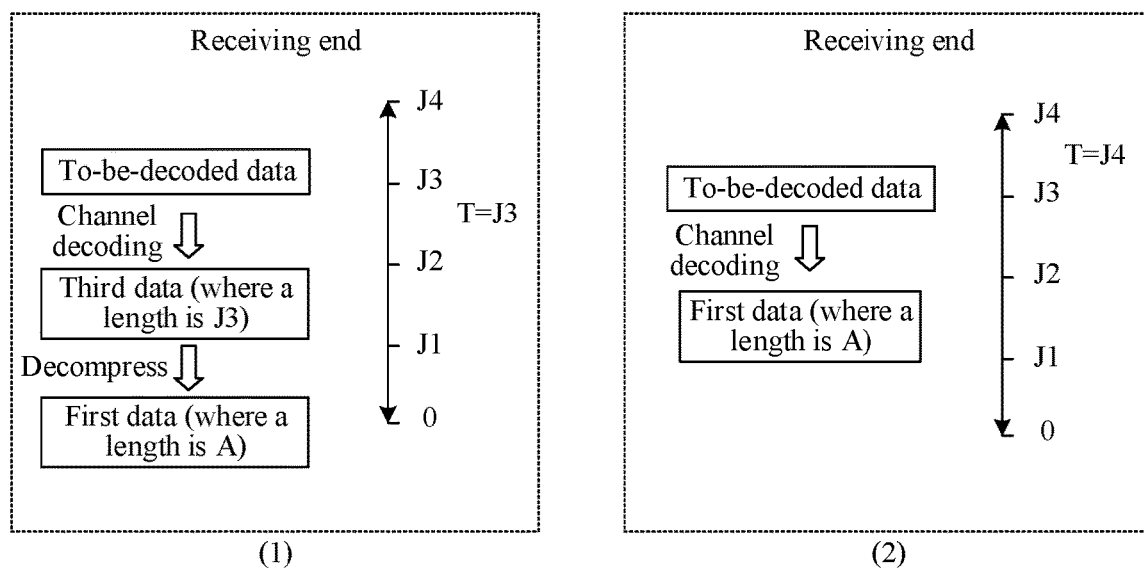
FIG. 11 is a schematic diagram 2 of performing channel decoding on to-be-decoded data by a receiving end according to an embodiment of this application.

For example, FIG. 11 is a schematic diagram 2 of performing channel decoding on the to-be-decoded data by the receiving end according to an embodiment of this application. In FIG. 11, J=4, p=0, and the J thresholds are successively $J_1$, $J_2$, $J_3$, and $J_4$ in ascending order. The J channel codes corresponding to the J thresholds are respectively a channel code 1, a channel code 2, a channel code 3, and a channel code 4. A code rate of the channel code 1 is $J_1/N$, a code rate of the channel code 2 is $J_2/N$, a code rate of the channel code 3 is $J_3/N$, and a code rate of the channel code 4 is A/N.

As shown in (1) in FIG. 11, when $J_2<C \leq J_3$, $T=J_3$, the receiving end may determine that a channel code corresponding to T3 is the channel code 3, and the code rate is $J_3/N$. Then, the receiving end may perform channel decoding on the to-be-decoded data by using the channel code 3, to obtain the third data, where the length of the third data is $J_3$.

As shown in (2) in FIG. 11, when $C>J_3$, $T=J_4$, the receiving end may determine that a channel code corresponding to T4 is the channel code 4, and the code rate is A/N. Then, the receiving end may perform channel decoding on the to-be-decoded data by using the channel code 4, to obtain the third data, where the length of the third data is A, and the third data is the first data.

S909: When $T \leq J_{n-1}$, the receiving end decompresses the third data, to obtain the first data. When $T>J_{n-1}$, the receiving end updates the third data to the first data. S909 may include the following step 15.

Step 15: When $T \leq J_{n-1}$, the receiving end decompresses the third data by using a decompression algorithm, to obtain the first data (as shown in (1) in FIG. 11). When T>Jn 1, the receiving end updates the third data to the first data (as shown in (2) in FIG. 11).

It should be noted that, for S901, S902, S905, S906, and S907 in the communication method shown in FIG. 9, refer to S301, S302, S304, S305, and S306 in the communication method shown in FIG. 3. Details are not described herein again.

In S901 to S909, the sending end needs to send the first information to the receiving end, and the receiving end may perform channel decoding on the to-be-decoded data based on the first information, and then decompress, to obtain the first data sent by the sending end. A process of determining and selecting the to-be-decoded data by the receiving end can be skipped, so that decoding complexity of the receiving end is simplified, and decoding performance of the receiving end is improved.

In the foregoing S901 to S909, because the first information corresponds to T, the channel code corresponding to T may indicate the channel code used by the sending end in the J channel codes corresponding to the J thresholds. In other words, the receiving end may obtain, by using the first information, a channel code used when the sending end performs channel encoding, and the receiving end may perform channel decoding on the to-be-decoded data based on the channel code corresponding to T, and then decompress and obtain the first data sent by the sending end. There is no need to perform blind detection (S607 and S608 shown in FIG. 6) on the to-be-decoded data, and a process of determining and selecting the to-be-decoded data by the receiving end can be skipped, so that the decoding complexity of the receiving end is simplified, and the decoding performance of the receiving end is improved.

In the foregoing S901 to S909, the receiving end does not need to perform blind detection on the to-be-decoded data. Therefore, the foregoing alignment bits may not need to be used for check, so that p may be 0, to simplify an implementation process of the communication method provided in this application.

It should be noted that, in the foregoing method embodiments, the compression algorithm used by the sending end is the same as the decompression algorithm used by the receiving end. For example, if the sending end uses an online arithmetic code as the compression algorithm, the receiving end needs to use a same online arithmetic code as the decompression algorithm. The compression algorithm and the decompression algorithm may be indicated by using scheduling information (for example, DCI). In other words, the sending end and the receiving end may determine, by using the scheduling information, the compression algorithm or the decompression algorithm to be used.

In the foregoing method embodiments, the check algorithm used by the sending end is the same as the check algorithm used by the receiving end. For example, if the sending end generates check data corresponding to the second data by using a generator matrix of parity check bits, the receiving end needs to check the first decoding result by using a same generator matrix of parity check bits. The generator matrix of parity check bits may be indicated by using the scheduling information. In other words, the sending end and the receiving end may determine the used generator matrix of parity check bits based on the scheduling information. For another example, if the sending end uses a CRC generator polynomial (such as a CRC 16 generator polynomial or a CRC 24 generator polynomial) to generate the check data corresponding to the second data, the receiving end needs to check the first decoding result by using a same CRC generator polynomial. The CRC generator polynomial may alternatively be indicated by using the scheduling information. In comparison with the generator matrix of parity check bits, the CRC generator polynomial occupies less storage space.

In some possible embodiments, the communication method provided in this application (which includes the method shown in FIG. 3, FIG. 6, FIG. 9) may be applied to a physical layer. In other words, for example, in the communication method embodiment shown in FIGS. 3, S301 to S305 may all be implemented at a physical layer of a sending end, and S306 to S308 may all be implemented at a physical layer of a receiving end.

In comparison with the foregoing manner of performing channel encoding on to-be-transmitted data shown in FIG. 2, in the communication method shown in FIG. 3 provided in this embodiment of this application, channel encoding is performed after the to-be-transmitted data is compressed and aligned. Channel encoding may be performed on the to-be-transmitted data after lossless compression, so that a code rate of a channel code during channel encoding can be reduced, to improve an error protection capability of channel encoding, reduce a BLER of transmission, and improve transmission reliability. In addition, a greater redundancy degree of the to-be-transmitted data indicates a shorter length of the to-be-transmitted data after the to-be-transmitted data is compressed and aligned. In other words, in this application, the code rate of the channel code during channel encoding can be adaptively adjusted based on the redundancy degree of the to-be-transmitted data. When the redundancy degree of the to-be-transmitted data is greater, the code rate of the channel code during channel encoding is lower, the error protection capability of channel encoding becomes stronger, the BLER becomes lower, and the transmission reliability is improved.

Figure 12:
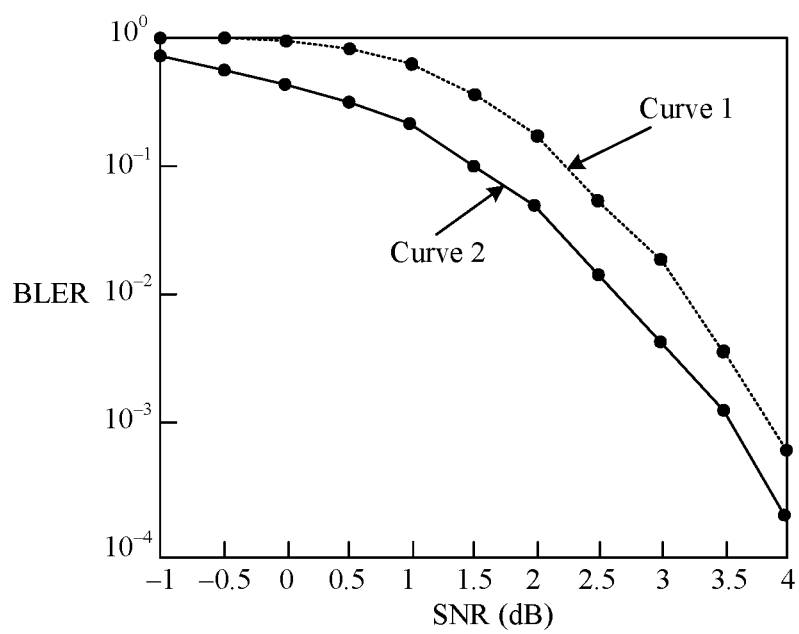
FIG. 12 is a schematic diagram in which a block error rate changes with a signal-to-noise ratio according to an embodiment of this application.

As shown in FIG. 12, a curve 1 and a curve 2 in FIG. 12 each indicate a condition in which a BLER changes with a signal-to-noise ratio (SNR). The curve 1 is collected at a sending end and a receiving end by using the communication method shown in FIG. 2. The curve 2 is collected in the communication method shown in FIG. 3 provided in this application.

It may be learned that, in comparison with a conventional technology, a BLER in the communication method provided in this application is lower. In addition, when a redundancy degree of to-be-transmitted data is greater, a code rate of a channel code correspondingly decreases more during channel encoding, an error protection capability of channel encoding becomes stronger, so does transmission reliability. In other words, in this application, the error protection capability of channel encoding may be adaptively adjusted based on the redundancy degree of the to-be-transmitted data, so that not only the error protection capability of channel encoding can be improved by using the redundancy degree of the to-be-transmitted data, but also a stronger error protection capability of channel encoding can be provided for the to-be-transmitted data with a greater redundancy degree. In some scenarios (for example, when data channel transmission is performed) in which retransmission is required, a quantity of retransmission times can be reduced, and a delay can be reduced.

It should be added that S301 to S305 may be summarized as follows: A sending end compresses first data into third data. Then, channel encoding is performed on the third data, where the third data obtained through channel encoding is fourth data. Finally, the fourth data is sent to a receiving end. S306 to S308 may be summarized as follows: the receiving end receives the fourth data from the sending end. Then, channel decoding is performed on the fourth data, where the fourth data obtained through channel decoding is the third data. Finally, the third data is decompressed into the first data.

Figure 13:
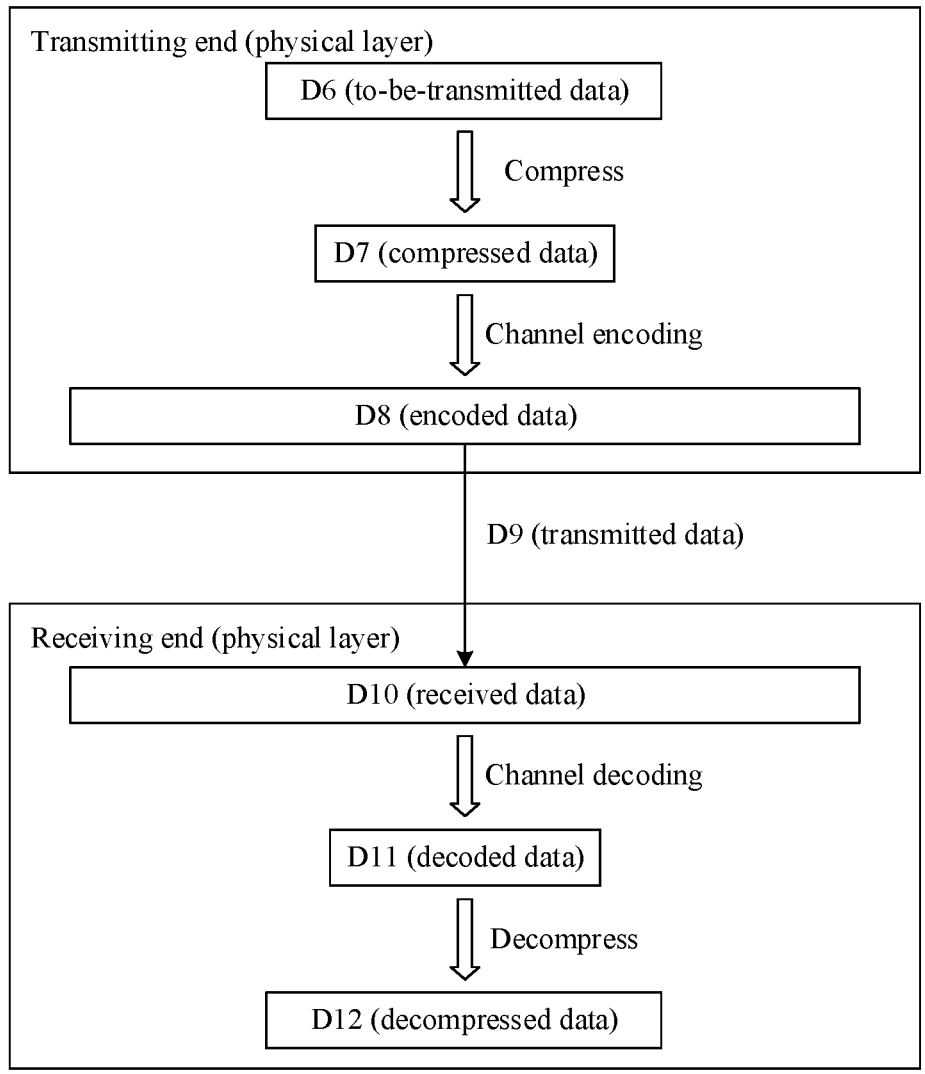
FIG. 13 is a schematic diagram sending end of sending data to a receiving end by a sending end according to an embodiment of this application.

As shown in FIG. 13, in a process in which a sending end sends data to a receiving end, a physical layer of the sending end first compresses D6 (to-be-transmitted data), to obtain D7 (compressed data). Then, the physical layer of the sending end performs channel encoding on D7, to obtain D8 (encoded data). Then, the physical layer of the sending end performs operations such as modulation and resource mapping on D8, to obtain D9 (transmitted data), and sends D9 to the receiving end. After receiving D9 from the sending end, the receiving end first performs operations such as resource demapping and demodulation on D9, to obtain D10 (received data, also referred to as to-be-decoded data). Then, a physical layer of the receiving end performs channel decoding on D10, to obtain D11 (decoded data). Finally, the physical layer of the receiving end decompresses D11, to obtain D12 (decompressed data), where D12 is D6 in the sending end. In this way, before performing channel encoding on a data packet, the physical layer of the sending end further compresses the data packet, to reduce a code rate of data during channel encoding, and improve an error protection capability of channel encoding. In brief, redundancy of the data packet can be fully used to improve transmission reliability. In some scenarios (for example, when data channel transmission is performed) in which retransmission is required, a quantity of retransmission times can be reduced, and a delay can be reduced.

In an embodiment of this application, an implementation of determining J thresholds may include the following manner 3 and manner 4.

In the manner 3, a sending end determines the J thresholds based on MAX corresponding to A.

For descriptions of MAX, refer to the foregoing descriptions, and details are not described herein again. The J thresholds are J values in an interval [0, MAX], and a maximum threshold in the J thresholds is MAX. In other words, the interval [0, MAX] may be divided into J intervals, and a right endpoint of each interval is one of the J thresholds. J may be a preset value, or J may be determined by the sending end based on a requirement. This is not limited in this application.

Optionally, the interval [0, MAX] may be evenly divided into the J intervals, and are successively (0, MAX/J], (MAX/J, 2 MAX/J], . . . , ((J−1) MAX/J, MAX], where the right endpoint of each interval is one of the J thresholds, in other words, the J thresholds may include [MAX/J], [2 MAX/J], . . . , [(J−1)MAX/J], and MAX. For example, it is assumed that A=256 bits, MAX=256+10=266 bits corresponding to A, and J=8. In this case, the J thresholds may include 32, 64, 96, 128, 160, 192, 224, and 266.

Optionally, the interval [0, MAX] may be divided into the J intervals based on a descending sequence including J numerical values. For example, it is assumed that MAX=266 bits corresponding to A, J=4, and the descending sequence is 100, 80, 60, and 16. In this case, the descending sequence may divide the interval [0, MAX] into (0, 100], (100, 180], (180, 240], and (240, 266], so that the J thresholds may include 100, 180, 240, 266.

Optionally, the interval [0, MAX] may be divided into the J intervals based on an ascending sequence including J numerical values. For example, it is assumed that MAX=266 bits corresponding to A, J=4, and the ascending sequence is 16, 60, 80, and 100. In this case, the ascending sequence may divide the interval [0, MAX] into (0, 16], (16, 76], (76, 156], and (156, 266], so that the J thresholds may include 16, 76, 156, 266.

In the manner 4, a sending end determines the J thresholds based on MAX and a plurality of pieces of to-be-transmitted data in a time period.

First J−1 thresholds that are arranged in ascending order and that is in the J thresholds are determined based on lengths of the plurality of pieces of to-be-transmitted data after compression, and a maximum threshold in the J thresholds is MAX.

Optionally, a largest threshold in the first J−1 thresholds that are arranged in ascending order and that is in the J thresholds is less than or equal to a maximum length of the plurality of pieces of to-be-transmitted data after compression.

Figure 14:
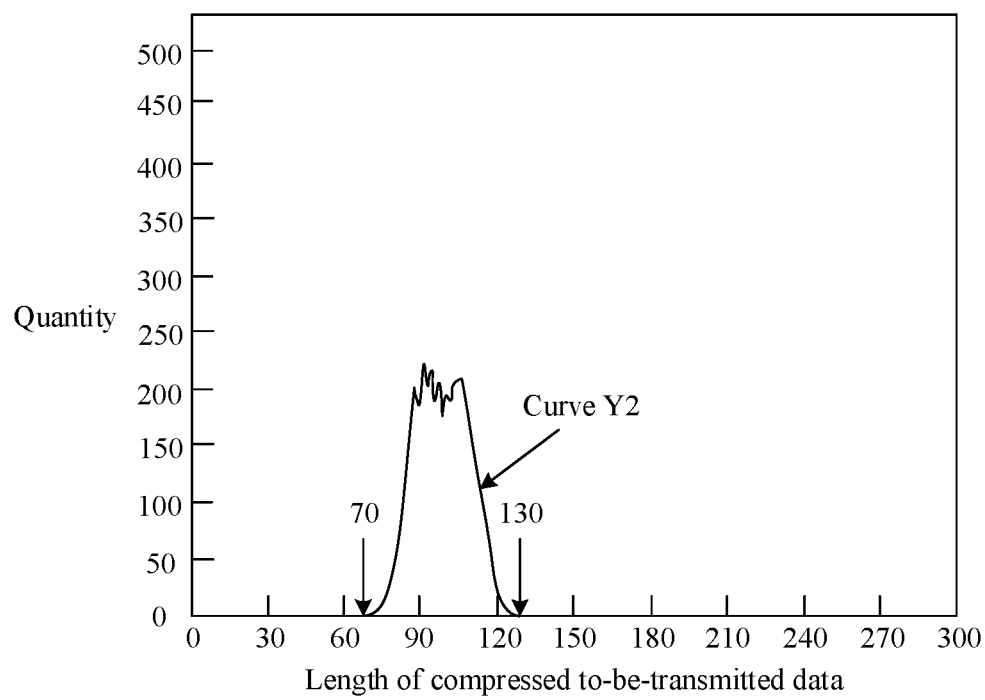
FIG. 14 is a schematic diagram 1 of statistics of a length of to-be-transmitted data after being compressed according to an embodiment of this application.

For example, it is assumed that MAX=266 bits and J=4. As shown in FIG. 14, a curve Y2 is a statistical curve of a quantity of lengths of the to-be-transmitted data after compression in a time period. It may be learned that the curve Y2 is centrally distributed in an interval [70, 130]. Therefore, the sending end may determine, in [70, 130], three numerical values as first three thresholds in ascending order of four thresholds, and determine 266 as a maximum threshold of the four thresholds. For example, the three values determined in [70, 130] may respectively be 70, 100, and 130, so that the four finally determined thresholds are 70, 100, 130, and 266.

In the foregoing manner 4, the lengths of the plurality of pieces of to-be-transmitted data after compression in a time period (which is referred to as historical compression length statistics below) may reflect the lengths of the plurality of pieces of to-be-transmitted data after compression in a future time period. Therefore, the J thresholds are determined by using the historical compression length statistics, so that the J thresholds that have a greater degree of matching with the length of the to-be-transmitted data after compression may be determined, to improve performance of "compression" and "alignment" in S302 and S303.

In the manner 3 or the manner 4, the sending end may further send, to a receiving end, third information indicating the J thresholds.

In an embodiment of this application, an implementation in which J thresholds are variable may include the following manner 5.

In the manner 5, a sending end determines K thresholds in J thresholds based on a plurality of pieces of to-be-transmitted data in a time period.

K is a positive integer, and K<J. First K−1 thresholds that are arranged in ascending order and that is in the K thresholds are determined based on the lengths of the plurality of pieces of to-be-transmitted data after compression, and a maximum threshold in the K thresholds is MAX.

Optionally, the largest threshold in the first K−1 thresholds that are arranged in ascending order and that is in the K thresholds is less than or equal to the maximum length of the plurality of pieces of to-be-transmitted data after compression.

Figure 15:
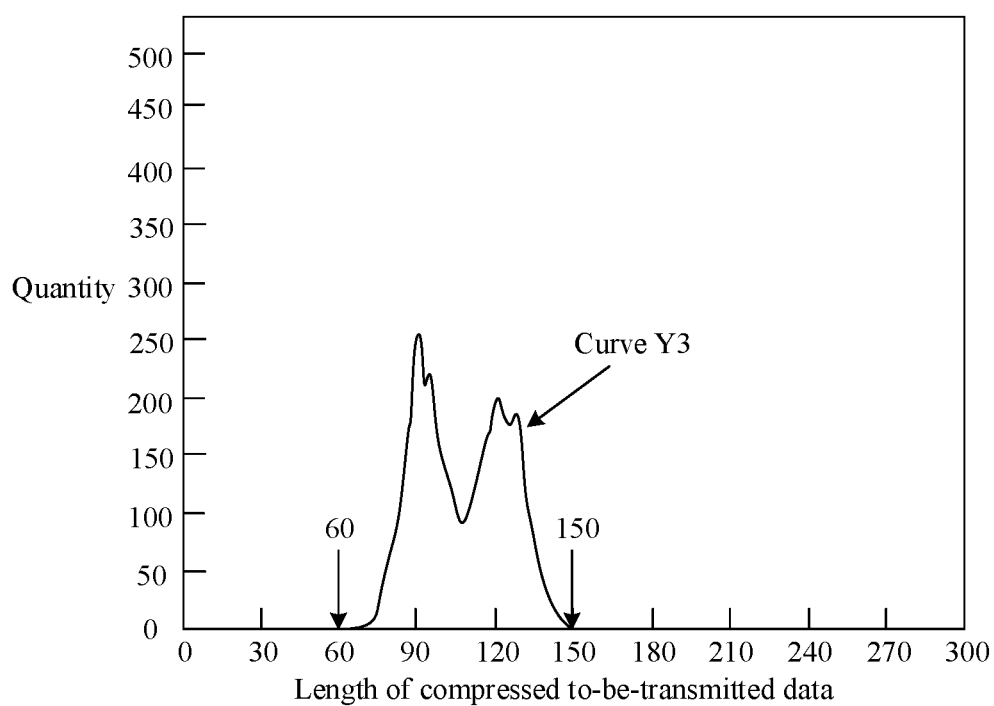
FIG. 15 is a schematic diagram 2 of statistics of a length of to-be-transmitted data after being compressed according to an embodiment of this application.

For example, it is assumed that MAX=266 bits corresponding to A, J=8. In this case, the J thresholds are respectively 32, 64, 96, 128, 160, 192, 224, and 266. As shown in FIG. 15, a curve Y3 is a statistical curve of a quantity of lengths of to-be-transmitted data after compression in a time period. It may be learned that the curve Y3 is centrally distributed in an interval [60, 150], and 64, 96, and 128 in the J thresholds fall into the interval [60, 150]. Therefore, it may be determined that the K thresholds are 64, 96, 128, and 266.

Optionally, the foregoing time period may be a sending time cycle or a sending quantity cycle.

The sending time cycle refers to a time period. For example, the sending time cycle is 10 s. In other words, the sending end determines the K thresholds in the J thresholds every 10 s based on a plurality of pieces of to-be-transmitted data within the 10 s. The sending quantity cycle refers to a data packet sending threshold. For example, the sending quantity cycle is 10000. In other words, each time the sending end sends 10000 pieces of to-be-transmitted data, the sending end determines the K thresholds in the J thresholds based on the 10000 pieces of to-be-transmitted data.

The length of sending cycle may be a preset value, or may be determined by the sending end. This is not limited in this application.

Optionally, a time period may be a sliding window. The sliding window may be understood as a recent time period, for example, a recent 10 s, or a sending threshold piece of to-be-transmitted data that is recently sent, for example, 10000 pieces of to-be-transmitted data that are recently sent.

That the sending end determines the K thresholds in the J thresholds based on the plurality of pieces of to-be-transmitted data in the sliding window may include: the sending end determines a first statistical feature of the lengths of the plurality of pieces of to-be-transmitted data after compression in the sliding window, and determines a difference between the first statistical feature and a second statistical feature. If the difference between the first statistical feature and the second statistical feature is greater than an adjustment threshold, the sending end determines the K thresholds in the J thresholds based on the plurality of pieces of to-be-transmitted data in the sliding window.

The first statistical characteristic includes one or more of the following: an average, a median, a minimum value, a maximum value, and the like. The second statistical feature refers to a statistical feature of the lengths of the plurality of pieces of to-be-transmitted data after compression in the sliding window when the K thresholds are determined in the J thresholds last time. The second statistical feature includes one or more of the following: an average, a median, a minimum value, a maximum value, and the like.

Figure 16:
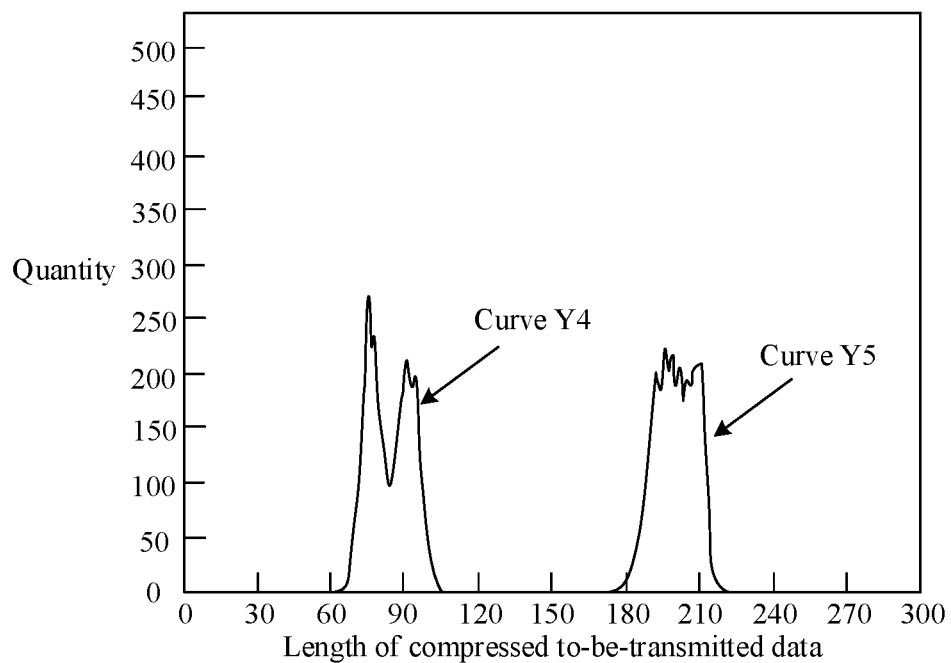
FIG. 16 is a schematic diagram 3 of statistics of a length of to-be-transmitted data after being compressed according to an embodiment of this application.

For example, it is assumed that MAX=266 bits corresponding to A, J=8. In this case, the J thresholds are respectively 32, 64, 96, 128, 160, 192, 224, and 266. As shown in FIG. 16, a curve Y4 is a statistical curve of a quantity of lengths of to-be-transmitted data after compression in a sliding window at a first moment, and a curve Y5 is a statistical curve of a quantity of lengths of to-be-transmitted data after compression in a sliding window at a second moment. It is assumed that at the first moment, the sending end determines the K thresholds in the J thresholds based on the curve Y4, and the K thresholds are respectively 64, 96, and 266. Further, it is assumed that the second statistical feature is a median 90 of the curve Y4. From the first moment, the sending end determines a median of the lengths of the plurality of pieces of to-be-transmitted data in each subsequent sliding window, and determines a difference between the median and 90. If the difference between the median and 90 is greater than an adjustment threshold (where it is assumed that the adjustment threshold is 50), the sending end determines the K thresholds in the J thresholds based on the plurality of pieces of to-be-transmitted data in the sliding window. For example, at the second moment, the sending end determines that a median of the curve Y5 is 200, and a difference between 200 and 90 is greater than 50. In this case, the sending end may determine the K thresholds in the J thresholds based on the curve Y5, and the K thresholds are respectively 192, 224, and 266. After the second moment, the sending end may determine the median 200 of the curve Y5 at the second moment as the second statistical feature, and continue to obtain the first statistical feature of the lengths of the plurality of pieces of to-be-transmitted data after compression in each subsequent sliding window, and determine the difference between the first statistical feature and the second statistical feature. In this way, the K thresholds may be periodically updated, so that a degree of matching between the K thresholds and the first statistical feature of the length of the to-be-transmitted data after compression is greater, and performance of "compression" and "alignment" in S302 and S303 is improved.

In the manner 5, the sending end is further configured to send, to a receiving end, fourth information indicating the K thresholds. The fourth information may be carried in DCI, in other words, the sending end and the receiving end may perform channel encoding or channel decoding on data by using K thresholds in the J thresholds.

In the manner 5, if the receiving end performs channel decoding on to-be-decoded data by using the S607, the receiving end may perform channel decoding on the to-be-decoded data by using K channel codes corresponding to the K thresholds, where K<J. In this way, decoding complexity of the receiving end can be reduced. If the receiving end performs channel decoding on the to-be-decoded data by using the S908, and K<J, a length of first information can be effectively reduced.

The foregoing describes in detail the communication method provided in embodiments of this application with reference to FIG. 3 to FIG. 16. The following describes in detail a communication apparatus provided in embodiments of this application with reference to FIG. 17 and FIG. 18.

Figure 17:
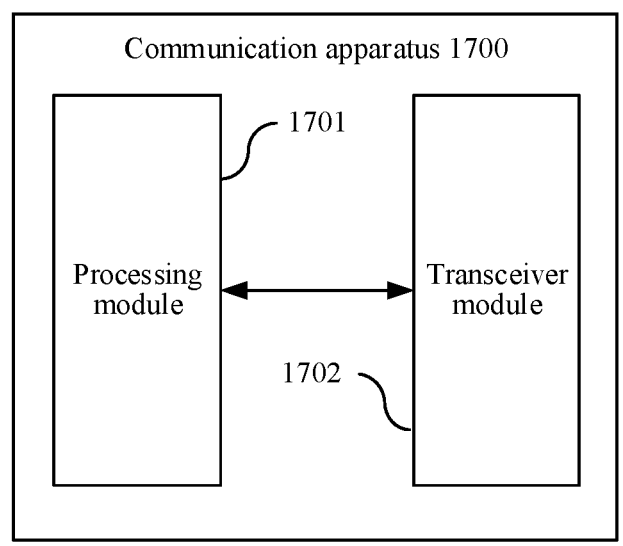
FIG. 17 is a schematic diagram 1 of a structure of a communication apparatus according to an embodiment of this application.

For example, FIG. 17 is a schematic diagram 1 of a structure of a communication apparatus according to an embodiment of this application. As shown in FIG. 17, a communication apparatus 1700 includes a processing module 1701 and a transceiver module 1702. For ease of description, FIG. 17 shows only main components of the communication apparatus.

In some embodiments, the communication apparatus 1700 is applicable to the communication system shown in FIG. 1, and performs functions of a sending end in the communication methods shown in FIG. 3, FIG. 6, and FIG. 9.

The processing module 1701 is configured to obtain first data, where a length of the first data is A, and A is a positive integer. The processing module 1701 is further configured to compress the first data into second data, where a length of the second data is C, and C is a positive integer. The processing module 1701 is further configured to generate third data based on the second data. The third data includes the second data and T−C+p alignment bits. T is a threshold in the J thresholds that is greater than or equal to C and the closest to C. The J thresholds correspond to A, and the J thresholds are greater than 0. J is a positive integer greater than or equal to 2. p is a quantity of auxiliary check bits, and p is an integer greater than or equal to 0. The processing module 1701 is further configured to perform channel encoding on the third data, to obtain fourth data. The transceiver module 1702 is configured to send the fourth data.

In some possible designs, the T−C+p alignment bits may be any one of the following: T−C+p check bits, T−C+p repeated bits, T−C+p "0" bits, or T−C+p "1" bits.

In some possible designs, the transceiver module 1702 is further configured to send first information, where the first information corresponds to T.

In some possible designs, the J thresholds are variable.

In some possible designs, transmission of the J thresholds may be performed by using any one of the following signaling: RRC signaling, DCI signaling, or MAC CE signaling.

The transceiver module 1702 is configured to implement a transceiver function of a sending end, for example, perform S305, S605, S904, and S906. The processing module 1701 may be configured to process data related to the first data, for example, perform S301 to S304, S601 to S604, S901, S902, S903, and S905. For a specific implementation process of the processing module 1701 and the transceiver module 1702, refer to related content in the method embodiment shown in any one of FIG. 3, FIG. 6, and FIG. 9. Details are not described herein again.

In some other embodiments, the communication apparatus 1700 is applicable to the communication system shown in FIG. 1, and performs functions of a receiving end in the communication methods shown in FIG. 3, FIG. 6, and FIG. 9.

The transceiver module 1702 is configured to receive to-be-decoded data, where the to-be-decoded data corresponds to N, and N corresponds to A. The processing module 1701 is configured to perform channel decoding on the to-be-decoded data, to obtain a first decoding result, where the first decoding result includes third data. The third data includes second data and T−C+p alignment bits. C is a length of the second data, and C is a positive integer. T is a threshold in the J thresholds that is greater than or equal to C and the closest to C. The J thresholds correspond to A, and the J thresholds are greater than 0. J is a positive integer greater than or equal to 2. p is a quantity of auxiliary check bits, and p is an integer greater than or equal to 0. The processing module 1701 is further configured to obtain first data based on the third data, where a length of the first data is A.

In some possible designs, the second data is obtained by compressing the first data.

In some possible designs, the first data may be a sequence that meets a similarity criterion and that is in a first candidate set. The first candidate set includes X1 candidate results that pass a check in X2 candidate results in a second candidate set. The second candidate set includes the X2 candidate results that pass interval confirmation in J candidate results in a third candidate set. The third candidate set includes the J candidate results obtained by decompressing and compressing the first decoding result based on the J thresholds.

In some possible designs, the T−C+p alignment bits may be any one of the following: T−C+p check bits, T−C+p repeated bits, T−C+p "0" bits, or T−C+p "1" bits.

In some possible designs, the transceiver module 1702 is further configured to receive first information, where the first information corresponds to T.

In some possible designs, the J thresholds are variable.

In some possible designs, transmission of the J thresholds may be performed by using any one of the following signaling: RRC signaling, DCI signaling, or MAC CE signaling.

The transceiver module 1702 is configured to implement a transceiver function of a receiving end, for example, perform S305, S306, S605, and S606. The processing module 1701 may be configured to process data related to the to-be-decoded data, for example, perform S307, S308, S607, S608, S908, and S909. For a specific implementation of the processing module 1701 and the transceiver module 1702, refer to related content in the method embodiment shown in any one of FIG. 3, FIG. 6, and FIG. 9. Details are not described herein again.

Optionally, the transceiver module 1702 may include a receiving module and a sending module (which is not shown in FIG. 17). The sending module is configured to implement a sending function of the communication apparatus 1700, and the receiving module is configured to implement a receiving function of the communication apparatus 1700.

Optionally, the communication apparatus 1700 may further include a storage module (which is not shown in FIG. 17), and the storage module stores a program or instructions.

When the processing module 1701 executes the program or the instructions, the communication apparatus 1700 can perform a function of a sending end or a receiving end in the communication method shown in any one of FIG. 3, FIG. 6, and FIG. 9.

It should be understood that the processing module 1701 in the communication apparatus 1700 may be implemented by using a processor or a circuit assembly related to a processor, and may be a processor or a processing unit. The transceiver module 1702 may be implemented by using a transceiver or a circuit assembly related to a transceiver, and may be a transceiver or a transceiver unit.

It should be noted that the communication apparatus 1700 may be a receiving end or a sending end, or may be a chip (system) or another component or assembly disposed in the receiving end or the sending end, or may be an apparatus including the receiving end or the sending end. This is not limited in this application. The receiving end refers to a device that receives data, and the receiving end may be a terminal device (for example, a mobile phone) or a network device (for example, a base station) in a communication system. The sending end refers to a device that sends data, and the sending end may be a terminal device (for example, a mobile phone) or a network device (for example, a base station) in a communication system. The sending end is configured to perform the communication method in any possible implementation in FIG. 3, FIG. 6, and FIG. 9, and the receiving end is configured to perform the communication method in any possible implementation in FIG. 3, FIG. 6, and FIG. 9.

In addition, for a technical effect of the communication apparatus 1700, refer to a technical effect of the communication method shown in any one of FIG. 3, FIG. 6, and FIG. 9. Details are not described herein again.

Figure 18:
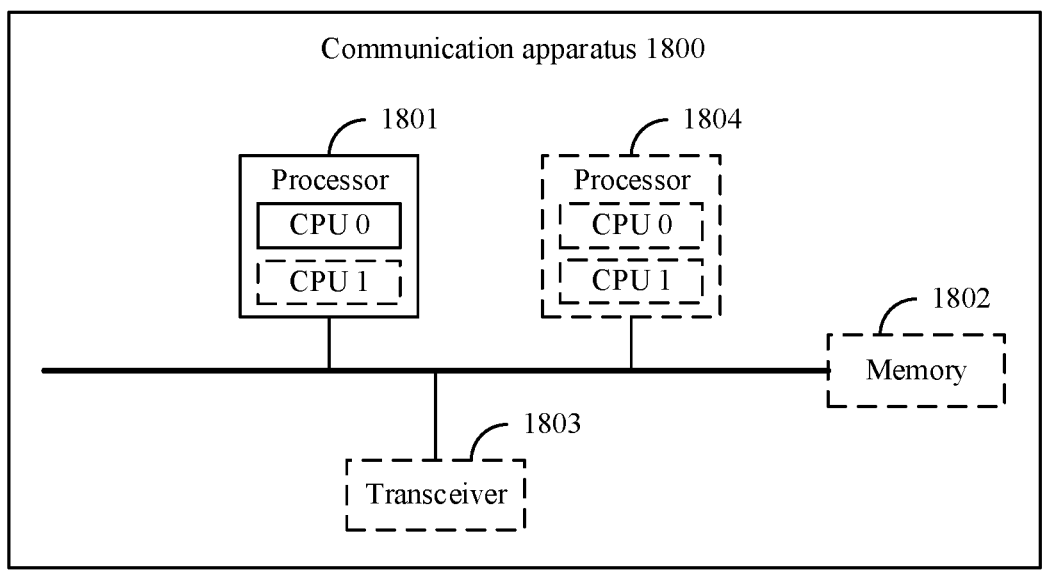
FIG. 18 is a schematic diagram 2 of a structure of a communication apparatus according to an embodiment of this application.

For example, FIG. 18 is a schematic diagram 2 of a structure of a communication apparatus according to an embodiment of this application. The communication apparatus may be a receiving end or a sending end, or may be a chip (system) or another component or assembly disposed in the receiving end or the sending end, or may be an apparatus including the receiving end or the sending end. This is not limited in this application. The receiving end refers to a device that receives data, and the receiving end may be a terminal device (for example, a mobile phone) or a network device (for example, a base station) in a communication system. The sending end refers to a device that sends data, and the sending end may be a terminal device (for example, a mobile phone) or a network device (for example, a base station) in a communication system.

As shown in FIG. 18, a communication apparatus 1800 may include a processor 1801. Optionally, the communication apparatus 1800 may further include a memory 1802 and/or a transceiver 1803. The processor 1801 is coupled to the memory 1802 and the transceiver 1803, for example, may be connected by using a communication bus.

The following describes components of the communication apparatus 1800 in detail with reference to FIG. 18.

The processor 1801 is a control center of the communication apparatus 1800, and may be a processor, or may be a collective name of a plurality of processing elements. For example, the processor 1801 is one or more central processing units (CPUs), or may be an application-specific integrated circuit (ASIC), or is configured as one or more integrated circuits that implement embodiments of this application, for example, one or more digital signal processor (DSPs), or one or more field programmable gate arrays (FPGAs).

Optionally, the processor 1801 may perform various functions of the communication apparatus 1800 by running or executing a software program stored in the memory 1802 and invoking data stored in the memory 1802.

In specific implementation, in an embodiment, the processor 1801 may include one or more CPUs, for example, a CPU 0 and a CPU 1 shown in FIG. 18.

In specific implementation, in an embodiment, the communication apparatus 1800 may alternatively include a plurality of processors, for example, the processor 1801 and a processor 1804 shown in FIG. 18. Each of these processors may be a single-core processor (single-CPU), or may be a multi-core processor (multi-CPU). The processor herein may be one or more devices, circuits, and/or processing cores configured to process data (for example, computer program instructions).

The memory 1802 is configured to store a software program for executing solutions of this application, and the processor 1801 controls execution of the software program. For a specific implementation, refer to the foregoing method embodiments. Details are not described herein again.

Optionally, the memory 1802 may be a read-only memory (ROM) or another type of static storage device that can store static information and instructions, a random access memory (RAM) or another type of dynamic storage device that can store information and instructions, an electrically erasable programmable read-only memory (EEPROM), a compact disc read-only memory (CD-ROM) or another compact disk storage, optical disc storage (including compact disc, laser disc, optical disc, digital versatile disc, Blu-ray disc, and the like), a magnetic disk storage medium or another magnetic storage device, or any other medium that can carry or store desired program code in a form of instructions or a data structure and that can be accessed by a computer, but is not limited thereto. The memory 1802 may be integrated with the processor 1801, or may exist independently, and is coupled to the processor 1801 by using an interface circuit (which is not shown in FIG. 18) of the communication apparatus 1800. This is not limited in this embodiment of this application.

The transceiver 1803 is configured to communicate with another communication apparatus. For example, the communication apparatus 1800 is a terminal device, and the transceiver 1803 may be configured to communicate with a network device, or communicate with another terminal device. For another example, the communication apparatus 1800 is an access network device, and the transceiver 1803 may be configured to communicate with a terminal device, or communicate with another access network device or a core network device.

Optionally, the transceiver 1803 may include a receiver and a transmitter (which is not separately shown in FIG. 18). The receiver is configured to implement a receiving function, and the transmitter is configured to implement a sending function.

Optionally, the transceiver 1803 may be integrated with the processor 1801, or may exist independently, and is coupled to the processor 1801 by using an interface circuit (which is not shown in FIG. 18) of the communication apparatus 1800. This is not limited in this embodiment of this application.

It should be noted that the structure of the communication apparatus 1800 shown in FIG. 18 does not constitute a limitation on the communication apparatus. An actual communication apparatus may include more or fewer components than those shown in the figure, combine some components, or have different component arrangements.

In addition, for a technical effect of the communication apparatus 1800, refer to a technical effect of the communication method described in the foregoing method embodiments. Details are not described herein again.

An embodiment of this application further provides a chip system, including a processor, where the processor is coupled to a memory, and the memory is configured to store a program or instructions. When the program or the instructions are executed by the processor, the chip system implements a method in any one of the foregoing method embodiments.

Optionally, there may be one or more processors in the chip system. The processor may be implemented using hardware or software. When implemented using hardware, the processor may be a logic circuit, an integrated circuit, or the like. When implemented using software, the processor may be a general-purpose processor, and be implemented by reading software code stored in the memory.

Optionally, there may be one or more memories in the chip system. The memory may be integrated together with the processor, or may be disposed separately from the processor. This is not limited in this application. For example, the memory may be a non-transitory processor, for example, a read-only memory ROM. The memory and the processor may be integrated on a same chip, or may be separately disposed on different chips. A type of the memory and a manner of disposing the memory and the processor are not limited in this application.

For example, the chip system may be a field programmable gate array (FPGA), an application specific integrated circuit (ASIC), a system-on-chip (SoC), a central processor unit (CPU), a network processor (NP), a digital signal processor (DSP), a micro controller unit (MCU), a programmable controller (PLD) or another integrated chip.

An embodiment of this application provides a communication system. The communication system includes one or more terminal devices and one or more network devices. The terminal device and the network device may perform the foregoing method embodiments in combination. For a specific performing process, refer to the foregoing method embodiments. Details are not described herein again.

This application further provides a computer-readable storage medium. The computer-readable storage medium stores a computer program. When the computer-readable storage medium is executed by a computer, a function of any one of the foregoing method embodiments is implemented.

This application further provides a computer program product. When the computer program product is executed by a computer, a function of any one of the foregoing method embodiments is implemented.

It should be understood that the processor in embodiments of this application may be a CPU, or the processor may be another general-purpose processor, a DSP, an ASIC, a FPGA, or another programmable logic device, a discrete gate, transistor logic device, a discrete hardware assembly, or the like. The general-purpose processor may be a microprocessor, or the processor may be any conventional processor, or the like.

It should be further understood that the memory in embodiments of this application may be a volatile memory or a non-volatile memory, or may include both a volatile memory and a non-volatile memory. The nonvolatile memory may be a ROM, a programmable read-only memory (PROM), an erasable programmable read-only memory EPROM), EEPROM, or flash memory. The volatile memory may be a random access memory (RAM). This is used as an external cache. In a manner of an example but not limitation, many forms of RAM are available, such as static random access memory (SRAM), dynamic random access memory (DRAM), synchronous dynamic random access memory (SDRAM), double data rate synchronous dynamic random access memory (DDR SDRAM), enhanced synchronous dynamic random access memory (ESDRAM), synchlink dynamic random access memory (SLDRAM) and direct rambus random access memory (DR RAM).

All or a part of the foregoing embodiments may be implemented by using software, hardware (such as a circuit), firmware, or any combination thereof. When implemented by using software, all or a part of the foregoing embodiments may be implemented in a form of a computer program product. The computer program product includes one or more computer instructions or computer programs. When the computer instructions or the computer program is loaded or executed on a computer, all or a part of the processes or functions in the embodiments of this application are generated. The computer may be a general-purpose computer, a dedicated computer, a computer network, or another programmable apparatus. The computer instructions may be stored in a computer-readable storage medium, or transmitted from one computer-readable storage medium to another computer-readable storage medium. For example, the computer instructions may be transmitted from one website site, computer, server, or data center to another website site, computer, server, or data center in a wired (for example, infrared, wireless, or microwave) manner. The computer-readable storage medium may be any available medium that can be accessed by a computer, or a data storage device such as a server or a data center that includes one or more available medium sets. The available medium may be a magnetic medium (for example, a floppy disk, a hard disk, or a magnetic tape), an optical medium (for example, a DVD), or a semiconductor medium. The semiconductor medium may be a solid-state drive.

In the specification, the claims, and the foregoing accompanying drawings of this application, terms "first", "second", "third", and the like are intended to distinguish between different objects but do not limit a particular order.

It should be understood that a term "and/or" in this application merely describes an association relationship between associated objects and indicates that three relationships may exist. For example, A and/or B may indicate the following three cases: Only A exists, both A and B exist, and only B exists, where A and B may be singular or plural. In addition, a character "/" in this specification generally indicates that associated objects are in an "or" relationship, or may indicate an "and/or" relationship. For details, refer to the foregoing and following descriptions for understanding.

In this application, "at least one" refers to one or more, and "a plurality of" refers to two or more than two. "At least one of the following" or a similar expression thereof indicates any combination of the following, including any combination of one or more of the following. For example, at least one of a, b, or c may represent a, b, c, a-b, a-c, b-c, or a-b-c, where a, b, and c may be one or more.

It should be understood that, in embodiments of this application, sequence numbers of the foregoing processes do not indicate a performing sequence. The performing sequence of the processes should be determined based on functions and internal logic of the processes, and should not constitute any limitation on implementation processes of embodiments of this application.

A person of ordinary skill in the art may be aware that units and algorithm steps in examples described with reference to embodiments disclosed in this specification may be implemented by electronic hardware, or a combination of computer software and electronic hardware. Whether these functions are executed in a manner of hardware or software depends on a specific application and a design constraint condition of a technical solution. A person skilled in the art may use different methods to implement the described functions for each specific application. However, it should not be considered that this implementation goes beyond the scope of this application.

It may be clearly understood by a person skilled in the art that, for a purpose of convenient and brief description, for a specific working process of the foregoing described system, apparatus, and unit, refer to a corresponding process in the foregoing method embodiments, and details are not described herein again.

In several embodiments provided in this application, it should be understood that the disclosed system, apparatus, and method may be implemented in another manner. For example, the foregoing described apparatus embodiments are merely examples. For example, the unit division is merely logical function division and may be other division in actual implementation. For example, a plurality of units or assemblies may be combined or integrated into another system, or some features may be ignored or not be performed. In addition, the displayed or discussed mutual coupling or direct coupling or communication connection may be implemented by using some interfaces, and the indirect coupling or the communication connection of the apparatuses or units may be implemented in an electrical, mechanical, or another form.

The units described as separate components may or may not be physically separate, and components displayed as units may or may not be physical units, in other words, may be located in one place, or may be distributed on a plurality of network units. A part or all of the units may be selected based on an actual requirement to achieve the objectives of the solutions in this embodiment.

In addition, functional units in embodiments of this application may be integrated into one processing unit, or each unit may exist alone physically, or two or more than two units are integrated into one unit.

When a function is implemented in a form of a software functional unit and sold or used as an independent product, the function may be stored in one computer-readable storage medium. Based on such an understanding, the technical solutions of this application essentially, or a part contributing to the conventional technology, or a part of the technical solutions may be implemented in a form of a software product. The software product is stored in a storage medium and includes several instructions for instructing a computer device (which may be a personal computer, a server, a network device, or the like) to perform all or a part of the steps of the methods described in embodiments of this application. The foregoing storage medium includes any medium that can store program code, such as a USB flash drive, a removable hard disk, a ROM, a RAM, a magnetic disk, or an optical disc.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A communication method, comprising:
obtaining first data, wherein a length of the first data is A, and A is a positive integer;
compressing the first data into second data, wherein a length of the second data is C, and C is a positive integer;
generating third data based on the second data, wherein the third data comprises the second data and T−C+p alignment bits, T is a threshold that is greater than or equal to C and closest to C and that is in J thresholds, the J thresholds correspond to A, each of the J thresholds is greater than 0, J is a positive integer greater than or equal to 2, p is a quantity of auxiliary check bits, and p is an integer greater than or equal to 0;
performing channel encoding on the third data, to obtain fourth data; and
sending the fourth data.

2. The method according to claim 1, wherein the T−C+p alignment bits are any one of the following: T−C+p check bits, T−C+p repeated bits, T−C+p "0" bits, or T−C+p "1" bits.

3. The method according to claim 1, wherein the method further comprises:
sending first information, wherein the first information corresponds to T.

4. The method according to claim 1, wherein the J thresholds are variable.

5. The method according to claim 1, wherein transmission of the J thresholds is performed by using any one of the following signaling: radio resource control (RRC) signaling, downlink control information (DCI) signaling, or media access control control element (MAC CE) signaling.

6. A communication method, comprising:
receiving to-be-decoded data, wherein the to-be-decoded data corresponds to N, and N corresponds to A, A is a positive integer;
performing channel decoding on the to-be-decoded data, to obtain a first decoding result, wherein the first decoding result comprises third data, wherein the third data comprises second data and T−C+p alignment bits, T is a threshold that is greater than or equal to C and closest to C and that is in J thresholds, the J thresholds correspond to A, each of the J thresholds is greater than 0, J is a positive integer greater than or equal to 2, C is a length of the second data, C is a positive integer, p is a quantity of auxiliary check bits, and p is an integer greater than or equal to 0; and
obtaining first data based on the third data, wherein a length of the first data is A.

7. The method according to claim 6, wherein the second data is obtained by compressing the first data.

8. The method according to claim 6, wherein the first data is a sequence that meets a similarity criterion and that is in a first candidate set;
the first candidate set comprises X1 candidate results that pass a check in X2 candidate results in a second candidate set;
the second candidate set comprises the X2 candidate results that pass interval confirmation in J candidate results in a third candidate set; and
the third candidate set comprises the J candidate results that are obtained by decompressing and compressing the first decoding result based on the J thresholds.

9. The method according to claim 6, wherein the T−C+p alignment bits are any one of the following: T−C+p check bits, T−C+p repeated bits, T−C+p "0" bits, or T−C+p "1" bits.

10. The method according to claim 6, wherein the method further comprises:
receiving first information, wherein the first information corresponds to T.

11. The method according to claim 6, wherein the J thresholds are variable.

12. The method according to claim 6, wherein transmission of the J thresholds is performed by using any one of the following signaling: radio resource control (RRC) signaling, downlink control information DCI signaling, or media access control control element (MAC CE) signaling.

13. A communication apparatus, wherein the communication apparatus comprises at least one processor and at least one memory, wherein
the at least one memory stores a computer program; and
the at least one processor is configured to execute the computer program stored in the memory, to enable the apparatus to:
obtain first data, wherein a length of the first data is A, and A is a positive integer;
compress the first data into second data, wherein a length of the second data is C, and C is a positive integer;
generate third data based on the second data, wherein the third data comprises the second data and T−C+p alignment bits, T is a threshold that is greater than or equal to C and closest to C and that is in J thresholds, the J thresholds correspond to A, each of the J thresholds is greater than 0, J is a positive integer greater than or equal to 2, p is a quantity of auxiliary check bits, and p is an integer greater than or equal to 0;
perform channel encoding on the third data, to obtain fourth data; and
send the fourth data.

14. The apparatus according to claim 13, wherein the T−C+p alignment bits are any one of the following: T−C+p check bits, T−C+p repeated bits, T−C+p "0" bits, or T−C+p "1" bits.

15. The apparatus according to claim 13, wherein the at least one processor further enables the apparatus to send first information, and the first information corresponds to T.

16. The apparatus according to claim 13, wherein the J thresholds are variable.

17. The apparatus according to claim 13, wherein transmission of the J thresholds is performed by using any one of the following signaling: radio resource control (RRC) signaling, downlink control information DCI signaling, or media access control control element (MAC CE) signaling.

18. The apparatus according to claim 13, wherein the apparatus is a terminal device or a chip.

* * * * *